(12) United States Patent
Nazarian

(10) Patent No.: US 11,227,654 B2
(45) Date of Patent: Jan. 18, 2022

(54) RESISTIVE RANDOM-ACCESS MEMORY AND ARCHITECTURE WITH SELECT AND CONTROL TRANSISTORS

(71) Applicant: CROSSBAR, INC., Santa Clara, CA (US)

(72) Inventor: Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 16/943,594

(22) Filed: Jul. 30, 2020

(65) Prior Publication Data

US 2021/0035636 A1    Feb. 4, 2021

Related U.S. Application Data

(60) Provisional application No. 62/880,246, filed on Jul. 30, 2019.

(51) Int. Cl.
*G11C 11/00* (2006.01)
*G11C 13/00* (2006.01)

(52) U.S. Cl.
CPC ........ *G11C 13/0028* (2013.01); *G11C 13/004* (2013.01); *G11C 13/0007* (2013.01);
(Continued)

(58) Field of Classification Search
CPC . G11C 13/004; G11C 13/0069; G11C 13/003; G11C 13/0002; G11C 13/0007; G11C 2213/79; G11C 2213/33; G11C 13/0061; G11C 2213/78; G11C 11/1673; G11C 13/0026; G11C 13/0064; G11C 14/00; G11C 13/0023
See application file for complete search history.

(56) References Cited

U.S. PATENT DOCUMENTS 7,830,698 B2 * 11/2010 Chen ................... H01L 45/149
                                                    365/148
2011/0317466 A1 * 12/2011 Fastow ................. G11C 5/063
                                                    365/72
(Continued)

OTHER PUBLICATIONS

Examination Report for corresponding Taiwan Patent Application No. 109125809 dated Apr. 6, 2021, 11 pages long.
(Continued)

*Primary Examiner* — Hien N Nguyen
(74) *Attorney, Agent, or Firm* — Wegman Hessler

(57) ABSTRACT

A semiconductor device includes memory devices respectively comprising a selector transistor in series with a control transistor and a memory cell, wherein the control transistor is connected to the memory cell. Control lines of the semiconductor device extend along a first direction, and a first control line is connected to a first memory device control transistor and a second memory device control transistor. Word lines extend in the first direction, and a first word line is connected to a first memory device selector transistor and a second memory device selector transistor. Bitlines extend in a second direction, with a first bitline connected to a first memory device memory cell and a second bitline is connected to a second memory device memory cell. Source lines extend in the second direction, and a first source line is connected to the first memory device selector transistor and the second memory device selector transistor.

20 Claims, 14 Drawing Sheets

(52) U.S. Cl.
CPC ...... *G11C 13/0026* (2013.01); *G11C 13/0069* (2013.01); *G11C 2213/79* (2013.01)

(56) References Cited

U.S. PATENT DOCUMENTS

| | | | |
|---|---|---|---|
| 2012/0314472 A1* | 12/2012 | Chung | ................ G11C 11/5678 |
| | | | 365/96 |
| 2013/0121079 A1 | 5/2013 | Wu et al. | |
| 2013/0201755 A1 | 8/2013 | Ezaki | |
| 2014/0204654 A1 | 7/2014 | Barth, Jr. et al. | |
| 2016/0315119 A1 | 10/2016 | Nakatsuka et al. | |
| 2017/0330622 A1* | 11/2017 | Liu | ..................... G11C 14/009 |
| 2020/0006429 A1 | 1/2020 | McCollum | |
| 2020/0006430 A1 | 1/2020 | McCollum | |

OTHER PUBLICATIONS

Notice of Allowance received for corresponding Taiwan Patent Application No. 109125809 dated Sep. 27, 2021, 2 pages.

* cited by examiner

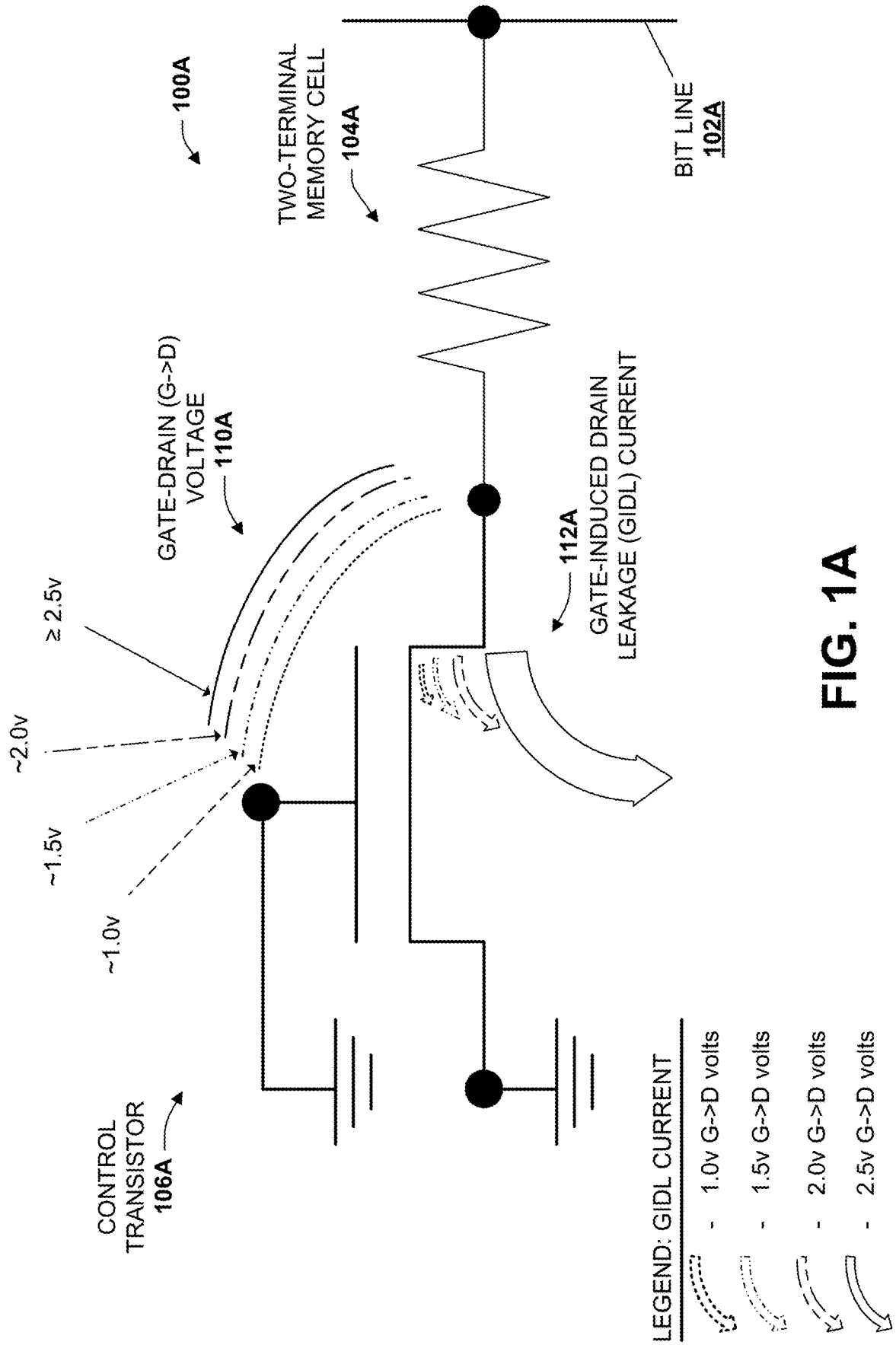

RESISTIVE RANDOM-ACCESS MEMORY AND ARCHITECTURE WITH SELECT AND CONTROL TRANSISTORS

CROSS-REFERENCE TO RELATED APPLICATION

The present application for patent claims the benefit of U.S. Provisional Application No. 62/880,246 filed on Jul. 30, 2019 and entitled "RESISTIVE RANDOM-ACCESS MEMORY AND ARCHITECTURE WITH SELECT AND CONTROL TRANSISTORS", which is hereby incorporated by reference herein in its entirety and for all purposes.

BACKGROUND

Embodiments of the present invention relate to computing devices. More specifically, embodiments of the present invention relate to efficient memory structures for computing devices.

In various embodiments the inventors of the present invention desire to reduce the size of memory structures, while preserving memory performance. One method considered by the inventors is to reduce the size of access transistors used within its memory devices. However, the mere reduction of transistor size, determined by the inventors, causes problems when using such transistors to read and write from its memory cells. Such problems include unintended leakage currents between sources and drains, leakage currents to the substrate, channel breakdowns, and the like within the reduced size transistor in the memory.

In light of the above, what is desired are new memory structures for computing devices without the drawbacks described above.

SUMMARY

Embodiments of the present invention include the use of two-transistors within a memory device. More specifically, two-transistors are now used to control the coupling and decoupling of a terminal of a two-terminal memory device between bit lines and source lines. In various embodiments, word lines are coupled to and used to control a first transistor, and control lines are coupled to and used to control the second transistor.

Aspects of the present disclosure provide an architecture for an array of resistive switching memory devices. A memory device of the array includes a control transistor connected in electrical series with a selector transistor and in series with a non-volatile resistive switching memory cell. The architecture provides a control line connected to a control gate of the control transistor, and a word line connected to a control gate of the selector transistor. The architecture facilitates independent electrical power on the control line and the word line, enabling the control transistor and the selector transistor to be activated or deactivated independently. In addition, the architecture provides a source line connected to a channel node (e.g., source, drain) of the selector transistor at a first end of the memory device, and a bit line connected to a first terminal of the resistive switching memory cell at a second end of the memory device. Furthermore, the bit line is a shared diffusion line (or shared metal conductor/wire) that is connected to a second memory device, at a first terminal of a second resistive switching memory cell of the second memory device.

In one or more aspects of the disclosed subject matter, there is provided a semiconductor device. The semiconductor device can comprise a semiconductor substrate, including a plurality of memory devices disposed upon the semiconductor substrate. Each memory device can respectively comprise a selector transistor, a control transistor, and a two-terminal memory cell. The selector transistor can be coupled to the control transistor, and the control transistor can be coupled to a first terminal of the two-terminal memory cell. Further, a plurality of control lines can be disposed upon the semiconductor substrate and connected to the plurality of memory devices, wherein the plurality of control lines extend in a first direction. A first control line of the plurality of control lines can be connected to a control transistor of a first of the plurality of memory devices and to a control transistor of a second of the plurality of memory devices. Further to the above, a plurality of word lines extending in the first direction can be disposed upon the semiconductor substrate and be connected to the plurality of memory devices. A first of the plurality of word lines can be connected to a selector transistor of the first memory device and to a selector transistor of the second memory device. Still further, a plurality of bit lines extending in a second direction different from the first direction can be disposed upon the semiconductor substrate and connected to the plurality of memory devices. A first of the plurality of bit lines can be connected to a second terminal of a two-terminal memory cell in the first memory device, and a second of the plurality of bit lines can be connected to a second terminal of a two-terminal memory cell in the second memory device. A plurality of source lines extending in the second direction can also be disposed upon the semiconductor substrate and connected to the plurality of memory devices. A first of the plurality of source lines can be connected to the selector transistor of the first memory device and to the selector transistor of the second memory device.

In other aspects disclosed herein, a method for operating a semiconductor device having a plurality of memory devices including a first memory device, a second memory device, a third memory device and a fourth memory device is disclosed. The method can comprise applying a first positive bias on a first control line from a plurality of control lines, wherein the first control line can be coupled to a first control transistor associated with the first memory device and to a second control transistor associated with the second memory device, and wherein the first control transistor and the second control transistor enter a conductive state in response to the first positive bias. The method can also comprise, concurrently with the applying the first positive bias, applying a second positive bias on a second control line connected to a third control transistor associated with the third memory device and to a fourth control transistor associated with the fourth memory device. The second positive bias can be less than the first positive bias, and the third control transistor and the fourth control transistor remain in a non-conductive state in response to the second positive bias. Additionally, the method can comprise concurrently with the applying the first positive bias, applying a third positive bias on a first word line from a plurality of word lines connected to a first selector transistor associated with the first memory device and to a second selector transistor associated with the second memory device. Further, the first selector transistor and the second selector transistor can enter a conductive state in response to the third positive bias. In some embodiments, the method can comprise concurrently with the applying the first positive bias, applying a ground signal on a second word line connected to a third selector transistor associated with the third memory device and to a fourth selector transistor associated with the fourth memory device. The third selector transistor and the fourth selector transistor can remain in a non-conductive state in response to the ground signal. Moreover, the method can comprise concurrently with the applying the first positive bias, applying a ground signal on a first bit line connected to a first two-terminal memory associated with the first memory device and to a third two-terminal memory associated with the third memory device, and applying a fourth positive bias on a second bit line connected to a second two-terminal memory associated with the second memory device and to a fourth two-terminal memory associated with the fourth memory device.

In still further embodiments, disclosed is a method for operating a semiconductor device having a plurality of memory devices including a first memory device, a second memory device, a third memory device and a fourth memory device. The method can comprise applying a first positive bias on a first control line connected to a first control transistor associated with the first memory device and to a second control transistor associated with the second memory device. Further, the first control transistor and the second control transistor can enter a conductive state in response to the first positive bias. The method can additionally comprise, concurrent with applying the first positive bias, applying a ground signal on a second control line connected to a third control transistor associated with the third memory device and to a fourth control transistor associated with the fourth memory device. Moreover, the third control transistor and the fourth control transistor can remain in a non-conductive state in response to the ground signal. In still further embodiments, the method can comprise concurrently with applying the first positive bias, applying a second positive bias on a first word line connected to a first selector transistor associated with the first memory device and to a second select transistor associated with the second memory device. In addition, the third selector transistor and the fourth selector transistor can enter a conductive state in response to the second positive bias. Further to the above, the method can comprise concurrently with applying the first positive bias, applying a third positive bias signal on a second word line connected to a third selector transistor associated with the third memory device and to a fourth selector transistor associated with the fourth memory device. Additionally, the third selector transistor and the fourth selector transistor can remain in a non-conductive state in response to the third positive bias. In one or more additional embodiments, the method can comprise concurrently with applying the first positive bias, applying a fourth positive bias signal on a first bit line connected to a first two-terminal memory associated with the first memory device and to a third two-terminal memory associated with the third memory device, and applying a ground signal on a second bit line connected to a second two-terminal memory associated with the second memory device and to a fourth two-terminal memory associated with the fourth memory device. In yet another embodiment, the method can comprise concurrently with applying the first positive bias, applying a fifth positive bias on a first source line connected to the first memory device, the second memory device, the third memory device and the fourth memory device.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIG. 1A depicts an example non-volatile memory cell according to one or more further embodiments of the present disclosure;

DETAILED DESCRIPTION

Introduction

Figure 1:
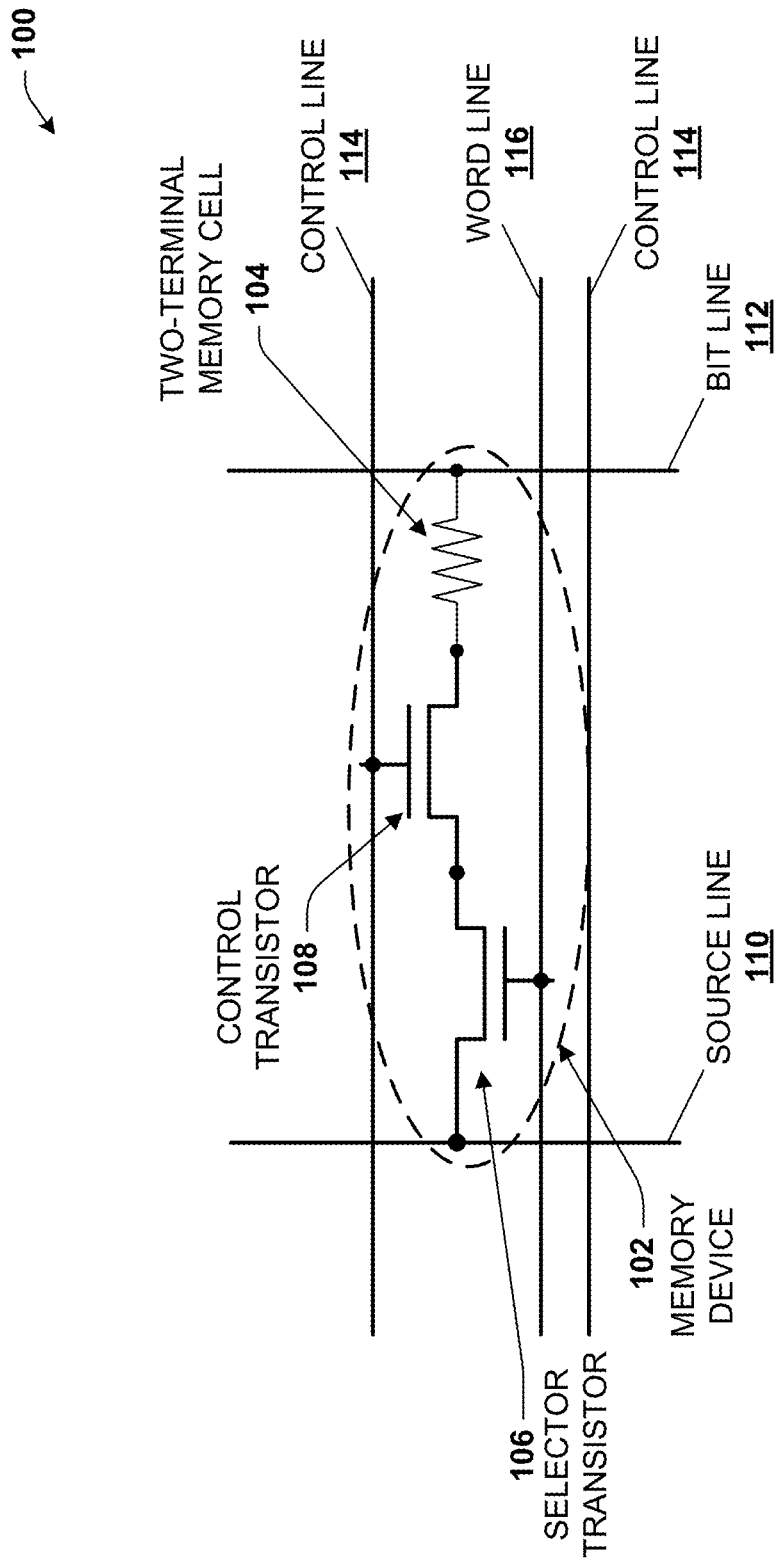
FIG. 1 illustrates a circuit diagram of an example non-volatile memory device and a control architecture for operating the memory device.

As the name implies, a two-terminal memory device has two terminals or electrodes. Herein, the terms "electrode" and "terminal" are used interchangeably. Generally, a first electrode of two-terminal memory is referred to as a "top electrode" (TE) and a second electrode of the two-terminal memory is referred to as a "bottom electrode" (BE), although it is understood that electrodes of two-terminal memory devices can be according to any suitable arrangement, including a horizontal arrangement in which components of a memory cell are (substantially) side-by-side rather than overlying one another. Situated between the TE and BE of a two-terminal memory device is typically an interface layer sometimes referred to as a switching layer, a resistive switching medium (RSM) or a resistive switching layer (RSL). When incorporating a RSM, the two-terminal memory device can be referred to as a (two-terminal) resistive switching device. Various embodiments of the present disclosure provide an array of memory devices respectively comprising a two-terminal resistive switching device connected in series with two transistors. Also provided is an architecture to control and operate the array of memory devices.

Composition of memory cells, generally speaking, can vary per device with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In some embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, Si3N4, SiNx, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include SixGeyOz (where x, y and z are respective suitable positive numbers), a silicon oxide (e.g., SiON, where N is a suitable positive number), a silicon oxynitride, an undoped amorphous Si (a-Si), amorphous SiGe (a-SiGe), TaOB (where B is a suitable positive number), HfOC (where C is a suitable positive number), TiOD (where D is a suitable number), Al2OE (where E is a suitable positive number) and so forth, a nitride (e.g. AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number $0<x<2$, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOy, TiOy, AlOy, etc.)

and SiOy, where x and y are typically non-stoichiometric values, or vice versa in a still further embodiment.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, and the following U.S. patent application assigned to the assignee of the present application for patent: application Ser. No. 14/588,185 filed Dec. 31, 2014; each of the foregoing patent applications are hereby incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., Ion) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. For example, when the conductive filament has been formed (e.g., in response to application of a program pulse), the conductance of the cell is greater than otherwise and the measured current (e.g., Ion) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., Ioff) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

For two-terminal memory formed at intersections of metal lines within a wafer (e.g., a crossbar array), the inventor(s) of the subject disclosure are cognizant of two general conventions for arrangement of the memory cells. A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a group of multiple memory cells is isolated from electrical effects of surrounding circuitry by one (or more) transistors. In the 1T1R context, individual memory cells can be configured to have high current suppression between memory cells, significantly reducing leakage path currents for the 1T1R memory array.

One example mechanism for connecting a 1T1R memory array is provided. A first terminal of a two-terminal resistive memory device can be connected to a drain of a transistor. A second terminal of the two-terminal resistive memory device can be connected to a bitline of the 1T1R memory array. The source of the transistor is grounded or used as a source for erase or program signals, depending on erase/programming conditions for the memory array.

Example Resistive Random-Access Memory and Architecture with Select and Control Transistors A one transistor-one resistor (1T1R) memory device typically includes a single transistor utilized to connect or disconnect a two-terminal resistive switching memory cell to control circuitry within an array. FIG. 1A illustrates an example 1T1R memory device 100A that can be connected in an array of similar memory devices. A bit line 102A can connect to a first terminal of a two-terminal resistive switching memory cell 104A at one end thereof, along with other devices of the array of similar memory devices (not depicted, but see FIGS. 2, 3 and 4, infra). A control transistor 106A is connected to a second terminal of the two-terminal resistive switching memory cell 104A. Activation and deactivation of control transistor 106A can facilitate access to two-terminal resistive switching memory cell 104A, by way of bit line 102A.

One problem observed with control transistor 106A at nanometer (nm) scales (e.g., 56 nm, 28 nm, and others) is gate-induced drain leakage (GIDL) current. At small nanometer scales, a gate oxide that separates a gate node from a drain node of control transistor 106A can be quite thin, resulting in reduction of energy band barriers afforded by the gate oxide insulator material. As a result, band-to-band tunneling can occur at the drain node, even at typical operating voltages associated with two-terminal resistive switching memory cell 104A. In response to the band-to-band tunneling a GIDL current from the drain node to a substrate node (or to a source node in the context of a silicon-on-insulator substrate) can occur. When large, and particularly when added to hundreds or thousands of other 1T1R memory devices connected to bit line 102A in an array, this GIDL current can become large enough to create a significant IR voltage drop on bit line 102A.

Gate-drain (G->D) voltage 110A illustrates several different gate-drain voltage magnitudes having different GIDL currents 112A respectively associated there with. Each gate-drain voltage is associated with a particular hash line pattern (illustrated between the gate node and drain node of control transistor 106A), and corresponds to a GIDL current represented by a solid arrow having the same hash line pattern. The size of the solid arrow is an indication (not to scale) of magnitude of the GIDL current. Thus, 1.0 v between the gate-drain nodes results in a tiny GIDL current, and a 1.5 v gate-drain voltage also corresponds with a very small GIDL current. However, for the example illustrated in FIG. 1A, a sizeable GIDL current can occur in response to a 2.0 v gate-drain voltage. Moreover, at 2.5 v gate-drain voltage a very large GIDL current can occur. In the latter case, a GIDL current between 10 nA and 20 nA would not be unusual for a control transistor 106A formed of a 28 nm technology process, for example. In array having 1000 1T1R memory devices 100A connected to bit line 102A, that GIDL current could be as large as 10 uA to 0 uA, which can produce significant IR voltage drops on bit line 102A, impacting operations of voltage drivers on the array.

Various embodiments of the present disclosure provide a memory device and array architecture to mitigate or avoid leakage currents associated with voltage stress on a control transistor. As an example, provided is a two transistor (2T) one resistor (1R) memory device. The 2T1R memory device can be connected to an architecture that facilitates voltages across the memory device sufficient to operate the two-terminal resistive memory, yet small enough on a single transistor node to minimize GIDL currents.

Referring now to FIG. 1, there is depicted an example 2T1R memory device and associated architecture 100 according to one or more embodiments of the present disclosure. A memory device 102 is illustrated having a two-terminal memory cell 104, in series with a control transistor 108 and selector transistor 106. In the embodiment illustrated by FIG. 1, two-terminal memory cell 104 is at one end of memory device 102, whereas other embodiments can rearrange relative positions of two-terminal memory cell 104, control transistor 108 and selector transistor 106 in manners not specifically depicted herein.

A first terminal of two-terminal memory cell 104 is connected to a bit line 112. A second terminal of two-terminal memory cell 104 is connected to a drain of control transistor 108, and a source of control transistor 108 is connected to a channel node of selector transistor 106. Additionally, a second channel node of selector transistor 106 is connected to a source line 110. Additionally, a gate node of control transistor 108 is connected to a control line 114 and a gate node of selector transistor 106 is connected to a word line 116. It should be understood that bit line 112, source line 110, control line 114 and word line 116 are independent conductive lines and can be operated independently of each other. Thus, a first voltage can be applied to control line 114, and a second voltage, ground or no voltage can concurrently be applied to word line 116, and similarly for source line 110 and bit line 112.

In operation, an operating voltage applied across bit line 112 and source line 110 is observed across memory device 102. To perform a memory operation on two-terminal memory cell 104, selector transistor 106 and control transistor 108 are activated with suitable activation voltages at word line 116, and control line 114, respectively. Note that these gate voltages will induce gate-drain voltages at the transistors (e.g., see FIGS. 2 and 3, infra). With selector transistor 106 and control transistor 108 activated, the operating voltage is applied across two-terminal memory cell 104. This operating voltage can then be utilized to program, erase or read two-terminal memory cell 104 as is known in the art.

Figure 2:
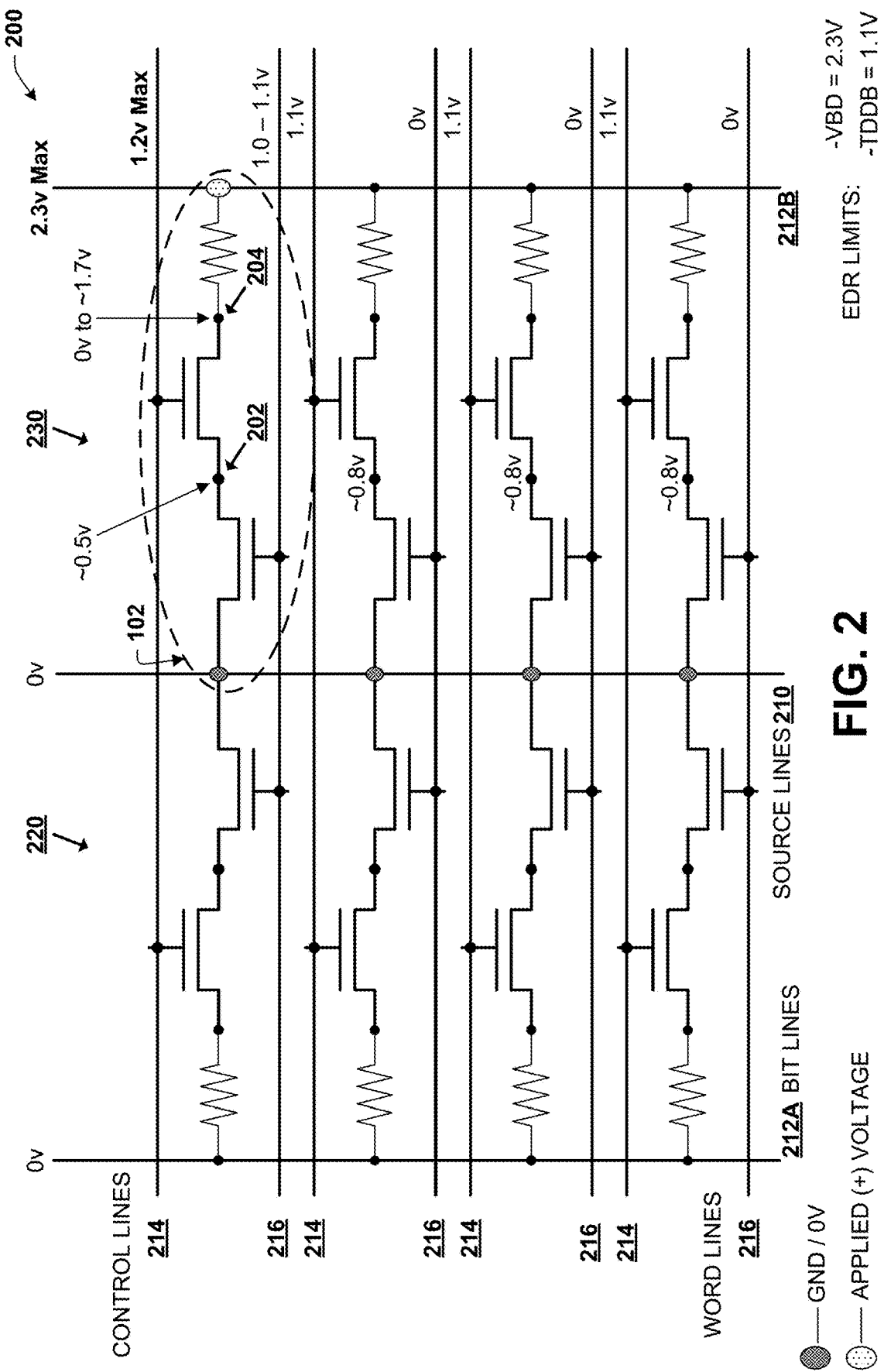
FIG. 2 depicts a circuit diagram of a sample memory device array and a control architecture for operating memory devices of the memory device array.

Referring now to FIG. 2, there is illustrated an array 200 of memory devices 102. It should be understood that although a two by four array of memory devices 102 is depicted, the array can have more columns and rows, or can be coupled to one or more other such arrays also with more columns and rows, in some alternative embodiments. Thus, additional memory devices can be included to the bottom, the top, the left or the right of the embodiment shown (or any suitable combination of the foregoing). As illustrated, columns 220, 230 of memory devices 102 are situated between one bit line 212A or 212B and a source line 210. Thus, a first column 220 of memory devices 102 is connected at one end thereof to source line 210 and at a second end to a first bit line 212A. Similarly, a second column 230 of memory devices 102 is connected at a first end to source line 210 and at a second end to a second bit line 212B. In the embodiment illustrated, source line 210 operates as a shared diffusion line (or a shared metal conductor or wire) between first column 220 and second column 230. Similarly, bit line 212A can operate as a shared diffusion line (conductor or wire) for a third column (not depicted) of memory device 102 to the left of bit line 212A, and bit line 212B can operate as a shared diffusion line (conductor or wire) for a fourth column (not depicted) of memory devices 102 to the right of bit line 212B.

The 2T1R structure of memory devices 102 facilitates reduced voltage stress on nodes of a control transistor associated with a two-terminal memory cell. Referring to memory device 102 within the dashed oval depicted by FIG. 2 (top right of array 200), a first node 202 is situated between a selector transistor of memory device 102 and a control transistor of memory device 102. A second node 204 is situated between the control transistor and a two-terminal memory of memory device 102.

To maintain voltage levels below the 2.5 volts associated with very high GIDL current (e.g., as described at FIG. 1A, supra), and in general below the 2.0 volts associated with elevated GIDL current (though voltages as high as 2 or 2.1 volts might be acceptable for relatively small array sizes, e.g., <1000 memory devices 102 per bit line 212B), a maximum of 2.3 volts is applied at second bitline 212B, relative to zero volts (or ground) applied at source line 210. This applies a potential bias of 2.3 volts across memory device 102. Depending on whether the two-terminal memory is in a high resistance or low resistance state, between about 0 volts and about 1.7 volts can appear at second node 204. Variations in these voltages (for a given potential bias across memory device 102) can depend on respective resistive values of the high resistance and low resistance states selected for the two-terminal memory upon fabrication, changes in those resistance values during normal operation, relative channel resistance of the control transistor and selector transistor, variations in channel resistance due to normal operation, or the like. Thus, variations from the stated value (e.g., 0, 1.7) within one to a few tenths of a volt (e.g., 0.1 volts, 0.2 volts, 0.3 volts, a range of 0.1 volts-0.5 volts or a suitable value there between) or a few percent of the value (e.g., 1%-25%, 5-20%, 1-15%, 5-15%, or any suitable value there between, or any suitable percentage range there between) are considered within the meaning of the term "about" as applied in this context. It should be understood that "about", "approximately" or other term of degree utilized herein is intended to refer to variations, ranges or values specified herein, variations, ranges or values reasonably understood by one of ordinary skill to provide the same or similar function and operation as described for a given component of a described device, component or element of a device, or method or step thereof. Thus, terms of degree generally refer to value or ranges that one of ordinary skill in the art would understand to facilitate operation of the various embodiments as described.

With voltage at second node 204 below 2.0 volts, GIDL current from a drain to substrate of the control transistor of memory device 102 will be small. Voltages of 1.2 volts maximum and between 1.0-1.1 volts are applied to a control line 214 and word line 216 connected to memory device 102. With reference to first node 202, the voltage at first node 204 is generally governed according to the following relationship:

$$V_{source(S)} = V_{gate(G)} - V_{threshold(T)} \text{ or}$$

$$V_S = V_G - V_T$$

In the case illustrated by FIG. 2, $V_T = \sim 0.7$ volts, and thus $V_S = 1.2 \text{ volts} - \sim 0.7 \text{ volts} = \sim 0.5$ volts.

Other memory devices in second column 230 have their respective word lines 216 at zero volts and control lines at 1.1 volts. The respective control transistors of these memory devices are activated, but their selector transistors are deactivated, minimizing current flow to source line 210. For these other (non-selected) memory devices, voltages at respective first nodes and second nodes are governed by voltage divider effects governed by relative resistance values of the (deactivated) selector transistors, (activated) control transistors and (either high or low resistance) two-terminal memory cells. As one example, a voltage of about 0.8 volts can appear at the second nodes of one or more of these memory devices, as illustrated.

In some embodiments, the two-terminal memory cells of array 200 are resistive random access memory devices currently under development by the Assignee of the present patent disclosure. For example, in some embodiments, the two-terminal memory cells operate upon the grown and retraction of metallic filaments within a resistive memory media. Metal particles from a first layer (e.g., an active or donor top electrode) of the two-terminal memory cell can drift into or within a resistive switching layer, forming a conductive portion therein embodied by a metallic filament. The resistive switching layer can be formed of a high electrical resistance material, but having defect locations suitable to allow the drift of metallic particles therein in response to the bias, and entrapment of the particles at reduced or zero bias. In these or other embodiments, a polarity of the two-terminal memory cell can be reversed from that depicted, and the top electrodes can be coupled to a drain node of an associated control transistor. In still further embodiments, bit lines 212A, 212B and source lines 210 can be inter-changed in position.

In one or more other embodiments, the two-terminal memory cells can be of other two-terminal memory cell technology, such as: conductive filamentary memory, phase-change memory, metal oxide memory, silicon sub-oxide memory, chalcogenide memory, magnetic memory, carbon nanotube memory, or the like. In FIG. 2 (also applicable to FIGS. 3 and 4, infra), the lightly shaded oval represents the polarity of the two-terminal memory cell: positive program voltage applied at the dot and across the memory cell induces the memory cell to transition from a high resistance state to a low resistance state, and a reverse bias across the memory cell induces the memory cell to transition from the low resistance state to the high resistance state. As mentioned above, the polarity of the memory cell can be inverted in some embodiments, based on engineering considerations. For the illustrated polarity and illustrated voltages applied to the bit lines, control lines, word lines and source line of FIG. 2, a program or write operation is performed upon the memory device 102 outlined within the dashed oval. For a different polarity, the illustrated voltages can implement an erase operation, in other embodiments.

Figure 3:
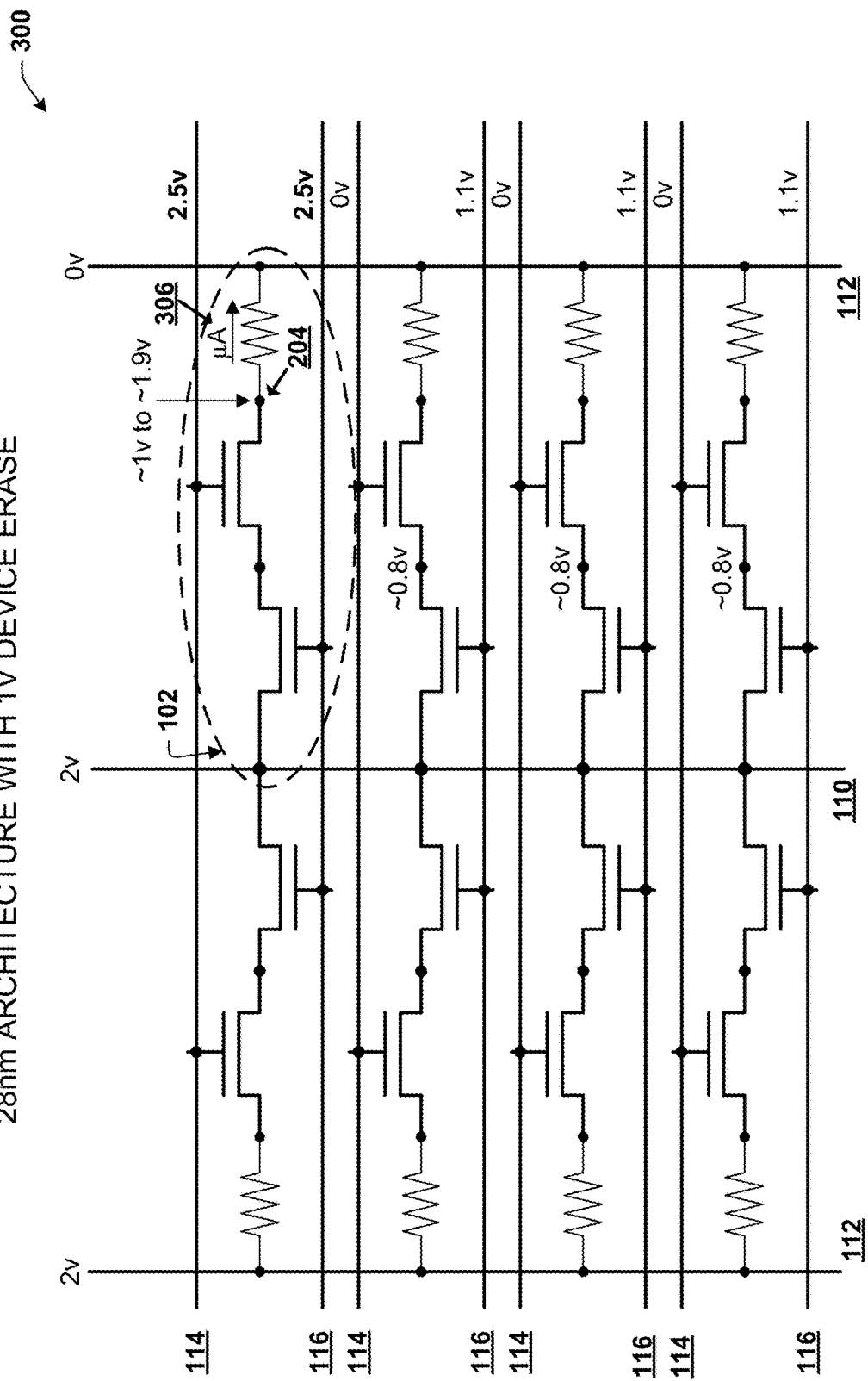
FIG. 3 illustrates a circuit diagram of an example memory device array and voltage diagrams for a memory device of the memory device array during erase operation.

FIG. 3 depicts an array 300 of memory devices 102 for a 28 nm memory device architecture according to alternative or additional embodiments of the present disclosure. Array 300 includes control lines 114 and word lines extending along a first direction, and bit lines 112 and a source line 110 extending along a second direction. A memory device 102 highlighted by the dashed oval in the upper right of array 300 is subject to an erase operation. Voltages for the erase process can be designed to accommodate the following conditions in one or more embodiments: a control transistor of memory device 102 can maintain a drain voltage of 2 volts (e.g., with little to no GIDL current), can maintain a gate voltage of 2.5 v and a source voltage of at least 1 volt. In at least one embodiment, an on resistance of a two-terminal memory cell of memory device 102 can be approximately 10 kiloohms (k). Further embodiments can be envisioned by one of ordinary skill in the art based on the disclosure provided herein. For example, a polarity of the two-terminal memory cell of memory device 102 can be reversed, and the voltages illustrated can be rearranged to program or erase the reversed polarity two-terminal memory cell. In other embodiments, the two-terminal memory cell can be repositioned within the memory device. For instance, the two-terminal memory cell can be connected between source line 110 and the selector transistor.

As illustrated by FIG. 3, a 2.5 v bias is applied to a control line 114 and a word line 116 connected to memory device 102. These voltages activate the control transistor and selector transistor. Further, 2 volts is applied at source line 110 and zero volts (or ground) applied at a bit line coupled to the two-terminal memory cell of memory device 102. This results in a 2 volt reverse potential bias (e.g., negative bias) across memory device 102. About 1 v to about 1.9 v is observed at a node 204, and a current 306 flows through the two-terminal memory cell in response to the reverse potential bias. In an embodiment, the current can be about 100 uA (or, e.g., up to about 200 uA or any suitable value or range there between) to facilitate erasing the two-terminal memory cell, and retracting or partially retracting a conductive filament (sufficient to break electrical continuity of the conductive filament) formed within the two-terminal memory cell.

In various embodiments, control signals utilized to apply the depicted voltages utilized for the erase procedure of FIG. 3 can be adapted to accommodate characteristics of one or more transistors, memory cells or memory devices depicted therein. For instance, one or more voltage signals can be ramped up over time to a depicted voltage, to reduce stress on a component of a target memory device, or of an adjacent memory device. In other embodiments, one or more voltage signals can be selected from a member of a group consisting of: as a voltage pulse, a series of voltage pulses, a ramp voltage, or a suitable combination of the foregoing. As one example, the 2.5 volts applied on control line 114 or word line 116 can be ramped up, pulsed, or applied as a series of pulses. Moreover, other voltages (e.g., 2 volts on source line 110, 2.0 volts on bit line 112, etc.) illustrated in FIG. 3 can be implemented according to one of the foregoing embodiments.

Non-selected memory devices 102 of array 300 are inhibited from the erase operation. The inhibition occurs in response to zero volts (or ground) applied to control lines of the non-selected memory devices 102, about 1.1 volts applied to associated word lines, and about 2.0 volts can be applied to other bit lines 112 of array 300. This prevents disturbing of the top left memory cell, which also observes the 2.5 v applied to the control line 114 and word line 116 connected to the top row of memory devices 102. However, because only 0.2 volts is dropped across the left-side bit line 112 and source line 110, the two-terminal memory cell observes no significant voltage and retains its previous state prior to the erase operation illustrated by FIG. 3.

Figure 4:
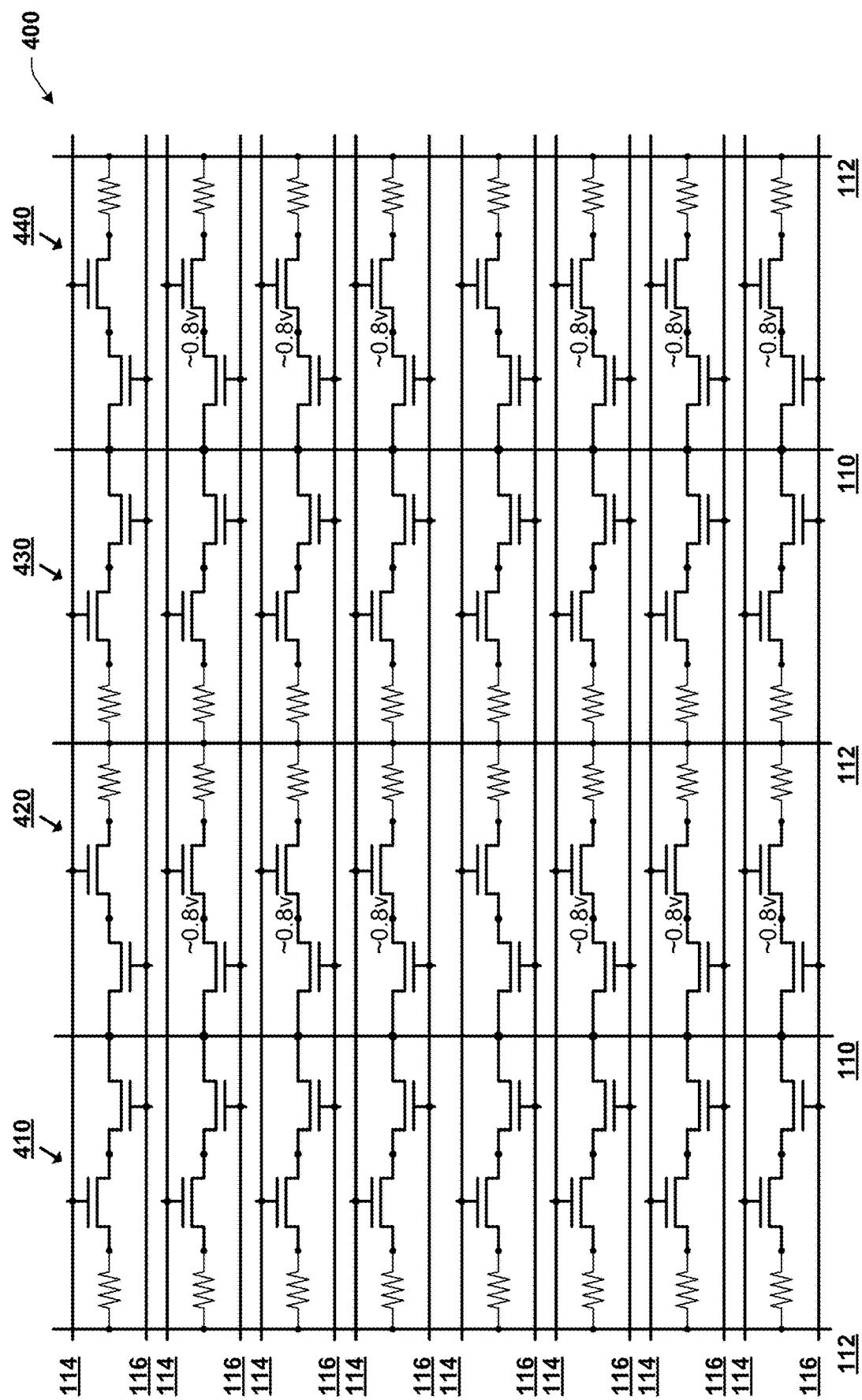
FIG. 4 depicts a circuit diagram of an example memory device array in one or more additional embodiments of the present disclosure.

As illustrated in FIG. 4, disclosed memory device arrays envision larger numbers of rows and columns of 2T1R memory devices 102. Particularly, an array 400 illustrated by FIG. 4 includes four columns of memory devices 102 (including columns 410, 420, 430, 440) and eight rows of memory devices 102, however much larger numbers of columns and rows are envisioned for array 400 and other arrays disclosed herein (e.g., 64, 128, 256, 512, 1024, 2056, . . . rows or columns, or any suitable combination). Nonetheless, disclosed architectures provide a control line 114 and word line 116 for each row of memory devices 102. Additionally, each column of memory devices 102 is positioned between and connected at one end to a bit line 112 and at a second end to a source line 110. Further, a source line 110 can be a shared diffusion line (conductor or wire), in various embodiments. For instance, a source line 110 can be shared by column 410 of memory devices and by column 420 of memory devices. Likewise, a bit line 112 can be a shared diffusion line (conductor or wire), shared by column 420 and by column 430. The shared diffusion line embodiment of the disclosed memory array architecture(s) facilitates increased memory density and reduced complexity of control lines utilized for the memory architecture. Coupled with independently controlled control lines and word lines, disclosed arrays 400 can achieve bit-level addressability without disturbing adjacent memory devices on shared diffusion lines (conductor or wire). This can be implemented, at least in part, by deactivating selector transistors (or control transistors) of adjacent rows of a target memory cell, and allowing adjacent bit lines to float (e.g., not driving the adjacent bit lines to any particular voltage), reducing voltages observed across neighboring columns and rows of memory devices.

The diagrams included herein are described with respect to interaction between several memory devices, memory device components, memory arrays or memory architectures. It should be appreciated that such diagrams can include those memory devices, components, arrays and architectures specified therein, some of the specified memory devices/components/arrays/architectures, or suitable alternative or additional memory devices/components/arrays/architectures. Sub-components can also be implemented as electrically connected to other sub-components rather than included within a parent architecture. Likewise, individual components can be implemented in a combined architecture according to other embodiments. Moreover, some of the disclosed embodiments can be implemented as part(s) of other disclosed embodiments where suitable.

Still further, one or more disclosed processes can be combined into a single process providing aggregate functionality. For instance, a program or erase process can comprise a read/verify process, or vice versa, to facilitate programming/erasing a memory cell and verifying completion of the programming/erasing by way of a single process. In addition, it should be appreciated that respective rows of multiple memory device architectures can be erased in groups (e.g., multiple rows erased concurrently) or individually. Moreover, it should be appreciated that multiple memory cells on a particular row can be read or programmed in groups (e.g., multiple memory cells read/programmed concurrently) or individually. Components of the disclosed architectures can also interact with one or more other components not specifically described herein but known by those of skill in the art or made reasonably evident to one of ordinary skill in the art by way of the context provided herein.

Figure 5:
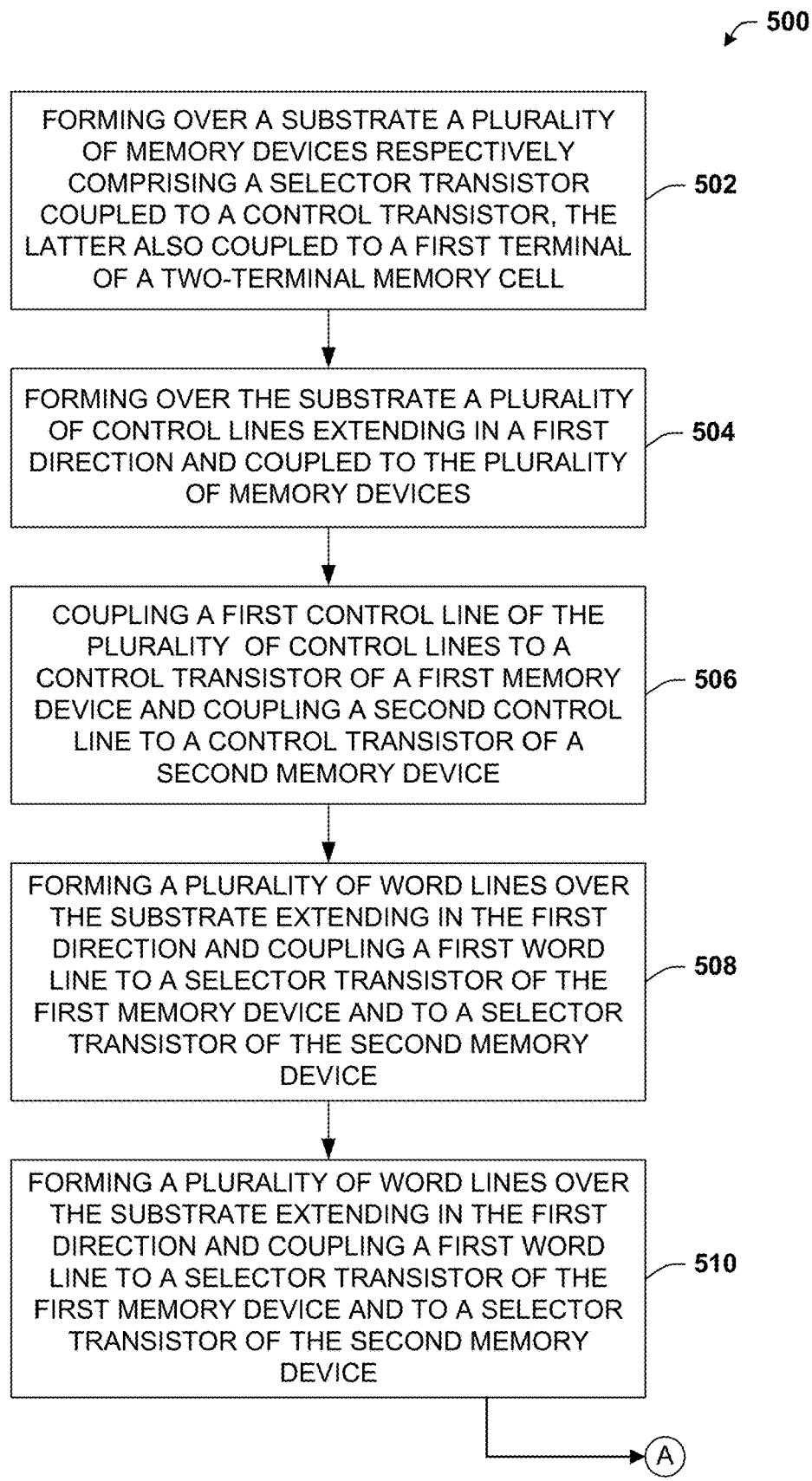
FIGS. 5, 6 and 7 illustrate a flowchart of a sample method for fabricating a memory device array and architecture for operating the array, in an embodiment.
Figure 6:
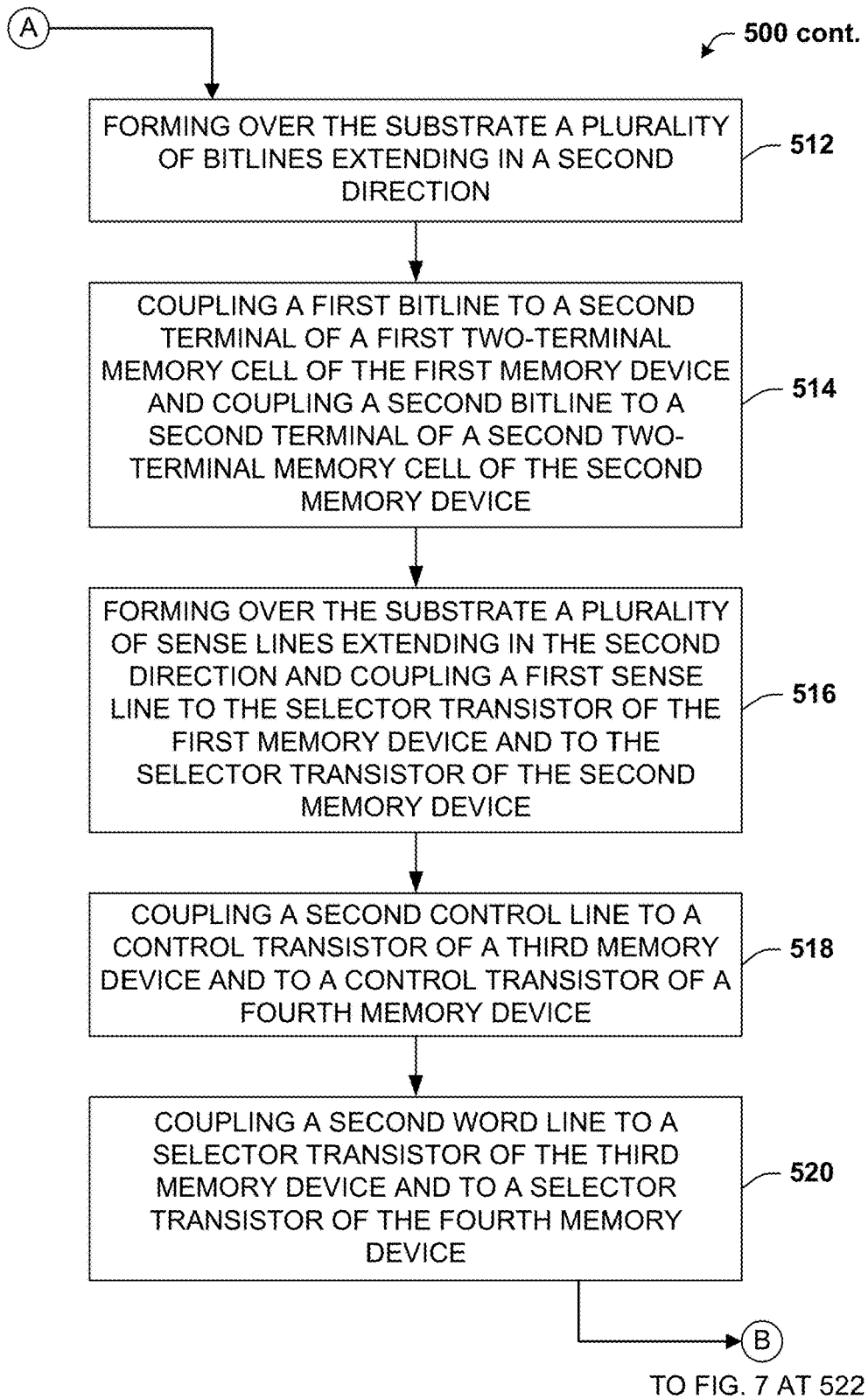
Figure 7:
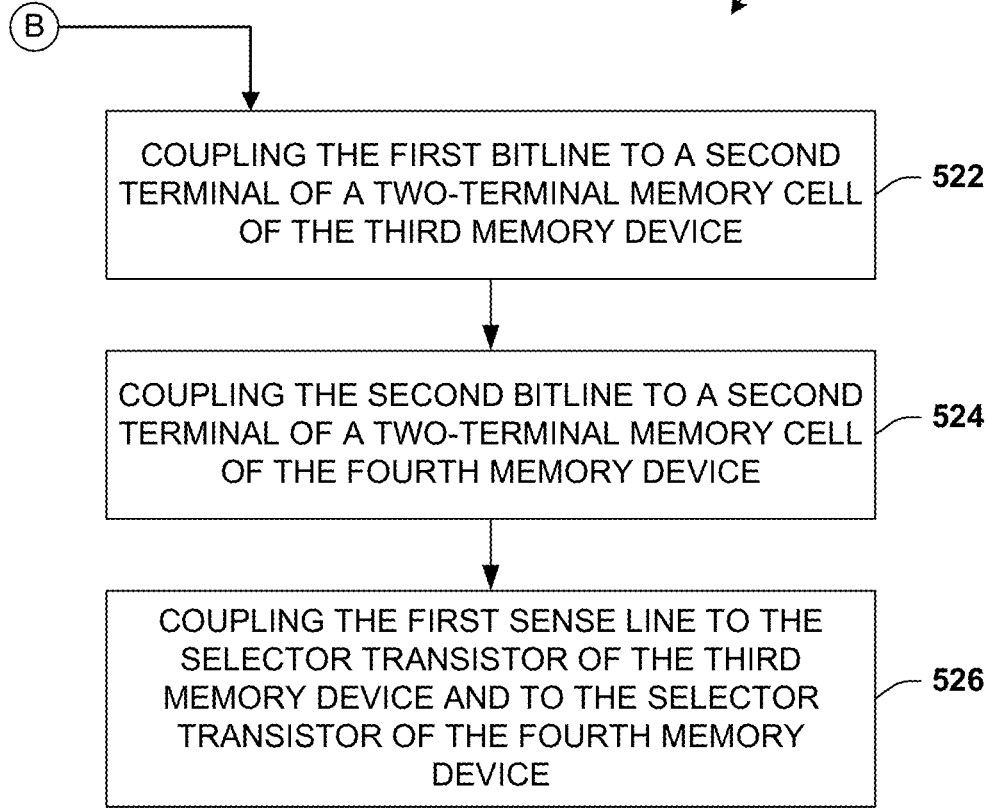

Referring now to FIG. 5-7, there is illustrated a flowchart of a sample method 500 according to further embodiments of the present disclosure. Referring initially to FIG. 5, at 502, method 500 can comprise forming over a substrate a plurality of memory devices respectively comprising a selector transistor connected to a control transistor, and the control transistor connected to a two-terminal memory cell. In at least some embodiments, the two-terminal memory cell can be connected to an opposite terminal of the selector transistor rather than the control transistor.

In further embodiments, at 504, method 500 can comprise forming over the substrate a plurality of control lines extending in a first direction and coupled to the plurality of memory devices. At 506, method 500 can comprise coupling a first control line of the plurality of control lines to a control transistor of a first memory device, and coupling a second control line to a control transistor of a second memory device.

In addition to the foregoing, method 500 can comprise, at 508, forming a plurality of word lines over the substrate extending in the first direction and coupling a first word lien to a selector transistor of the first memory device and to a selector transistor of the second memory device. Further, at 510, method 500 can comprise forming a plurality of word lines over the substrate extending in the first direction and coupling a first word line to a selector transistor of the first memory device and to a selector transistor of the second memory device.

Turning to FIG. 6, method 500 continues at 512, and can comprise forming over the substrate a plurality of bitlines extending in a second direction. At 514, method 500 can also comprise coupling a first bitline to a second terminal of a first two-terminal memory cell of the first memory device and coupling a second bitline to a second terminal of a second two-terminal memory cell of the second memory device. Still further, at 516, method 500 can comprise forming over the substrate a plurality of source lines extending in the second direction and coupling a first source line to the selector transistor of the first memory device and to the selector transistor of the second memory device.

At 518, method 500 can further comprise coupling a second control line to a control transistor of a third memory device and to a control transistor of a fourth memory device. In addition, at 520, method 500 can comprise coupling a second word line to a selector transistor of the third memory device and to a selector transistor of the fourth memory device. From 520, method 500 proceeds on FIG. 7 at 522.

Continuing method 500, at 522 on FIG. 7, the method can comprise coupling the first bitline to a second terminal of a two-terminal memory cell of the third memory device. Moreover, at 524, method 500 can comprise coupling the second bitline to a second terminal of a two-terminal memory cell of the fourth memory device and, at 526, can comprise coupling the first source line to the selector transistor of the third memory device and to the selector transistor of the fourth memory device.

Figure 8:
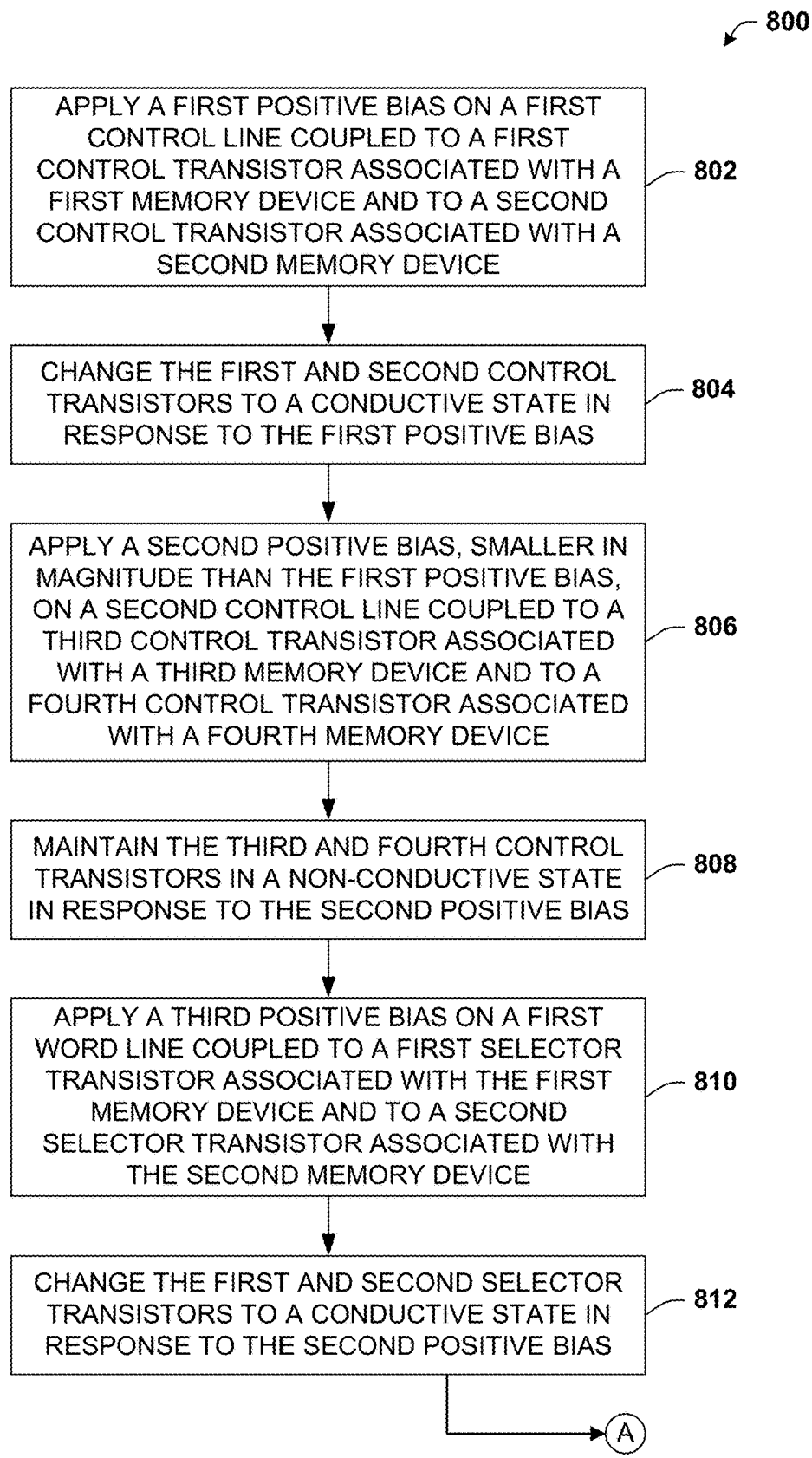
FIGS. 8 and 9 depict a flowchart of an example method for operating a memory device array in a further embodiment.
Figure 9:
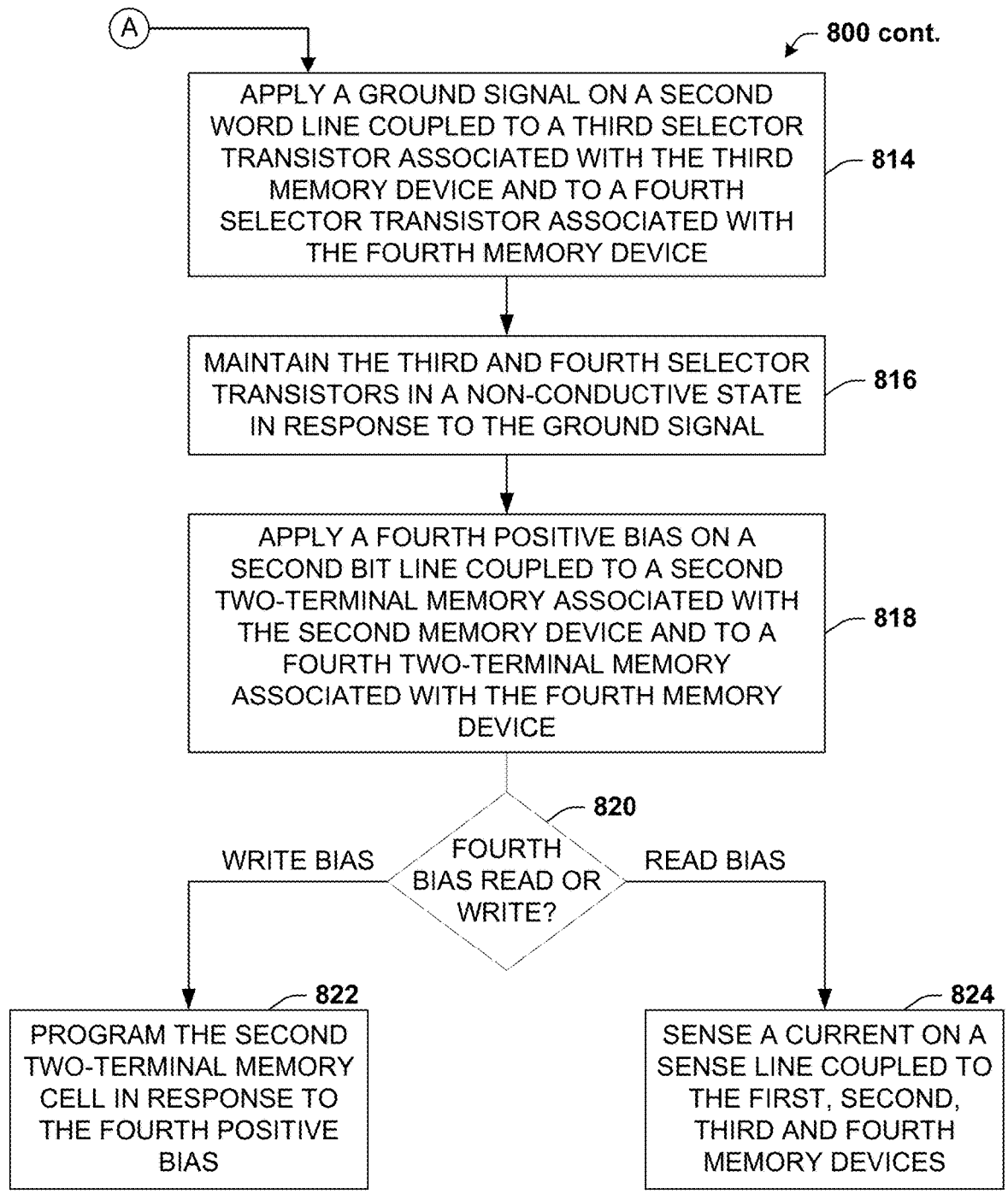

Referring now to FIGS. 8 and 9, there is depicted a method 800 for operating a semiconductor device having a plurality of memory devices, including a first memory device, a second memory device, a third memory device and a fourth memory device. Beginning initially at FIG. 8, method 800 can comprise, at 802, applying a first positive bias on a first control line coupled to a first control transistor associated with a first memory device and to a second control transistor associated with a second memory device. Further, at 804, method 800 can comprise changing the first and second control transistors to a conductive state in response to the first positive bias.

At 806, method 800 can comprise applying a second positive bias, smaller in magnitude than the first positive bias, on a second control line coupled to a third control transistor associated with a third memory device and to a fourth control transistor associated with a fourth memory device. At 808, method 800 can comprise maintaining the third and fourth control transistors in a non-conductive state in response to the second positive bias.

Still further to the above, method 800 can comprise at 810 applying a third positive bias on a first word line coupled to a first selector transistor associated with the first memory device and to a second selector transistor associated with the second memory device. At 812, method 800 can comprise changing the first and second selector transistors to a conductive state in response to the second positive bias. From 812, method 800 proceeds to FIG. 9 at reference number 814.

At 814 of FIG. 9, method 800 can comprise applying a ground signal on a second word line coupled to a third selector transistor associated with the third memory device and coupled to a fourth selector transistor associated with the fourth memory device. At 816, method 800 can comprise maintaining the third and fourth selector transistors in a non-conductive state in response to the ground signal.

At 818, method 800 can comprise applying a fourth positive bias on a second bit line coupled to a second two-terminal memory associated with the second memory device and to a fourth two-terminal memory associated with the fourth memory device. At 820, method 800 can comprise determining whether the fourth positive bias is a read bias or a write bias. In response to the fourth positive bias being the write bias, method 800 proceeds to 822 and can comprise programming the second two-terminal memory cell in response to the fourth positive bias. Otherwise, in response to the fourth positive bias being the read bias, method 800 proceeds 824 and can comprise sensing a current on a source line coupled to the first, second, third and fourth memory devices.

In one or more embodiments, the source line is one of a plurality of source lines of the semiconductor device. Further, the method can comprise sensing the current in conjunction with determining a state of the second two-terminal memory cell. In another embodiment, a leakage current of the fourth select transistor is reduced in response to applying the second positive bias signal to the second control line.

Figure 10:
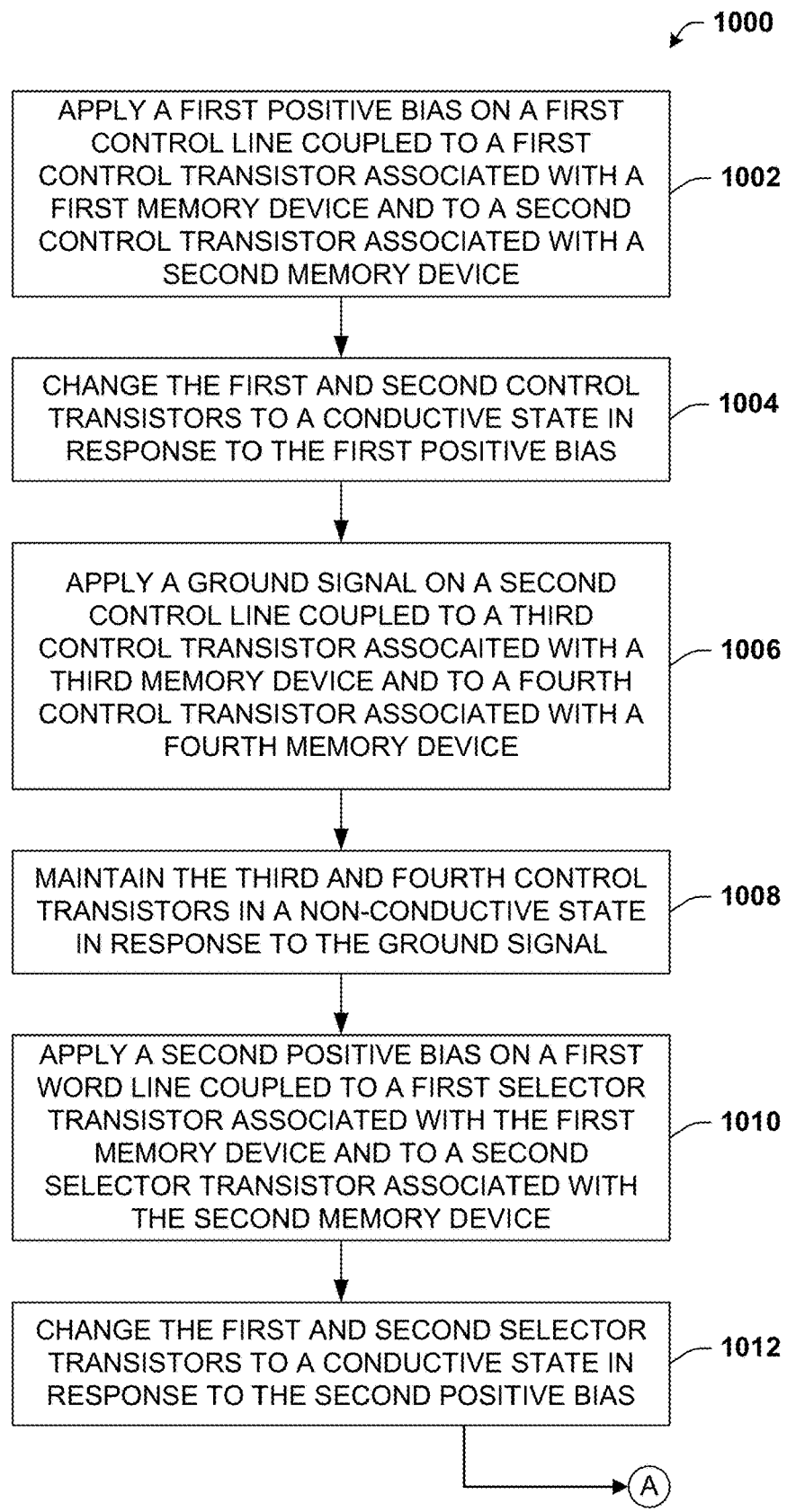
FIGS. 10 and 11 illustrate a flowchart of an example method for operating a memory device array according to still further embodiments of the present disclosure.

In alternative or additional embodiments, a maximum voltage of the first positive bias can be within a range of about 1 to about 1.2 volts. In a further embodiment, a maximum voltage of the second positive bias can be within a range of about 0.9 to about 1.1 volts. In still other embodiments, the fourth positive bias can be within a range of about 2 to about 2.3 volts Referring to FIGS. 10 and 11, a method 1000 is depicted for operating a memory array having a plurality of memory devices including a first memory device, a second memory device, a third memory device and a fourth memory device. Method 800, at 802, can comprise applying a first positive bias on a first control line coupled to a first control transistor associated with a first memory device and to a second control transistor associated with a second memory device. Additionally, at 804, method 800 can comprise changing the first and second control transistors to a conductive state in response to the first positive bias.

At 1006, method 1000 can comprise applying a ground signal on a second control line coupled to a third control transistor associated with a third memory device and to a fourth control transistor associated with a fourth memory device. At 1008, method 1000 can comprise maintaining the third and fourth control transistors in a non-conductive state in response to the ground signal.

In addition to the foregoing, at 1010, method 1000 can comprise applying a second positive bias on a first word line coupled to a first selector transistor associated with the first memory device and to a second selector transistor associated with the second memory device. At 1012, method 1000 can comprise changing the first and second selector transistors to a conductive state in response to the second positive bias. From 1012, method 1000 can proceed to reference number 1014.

Figure 11:
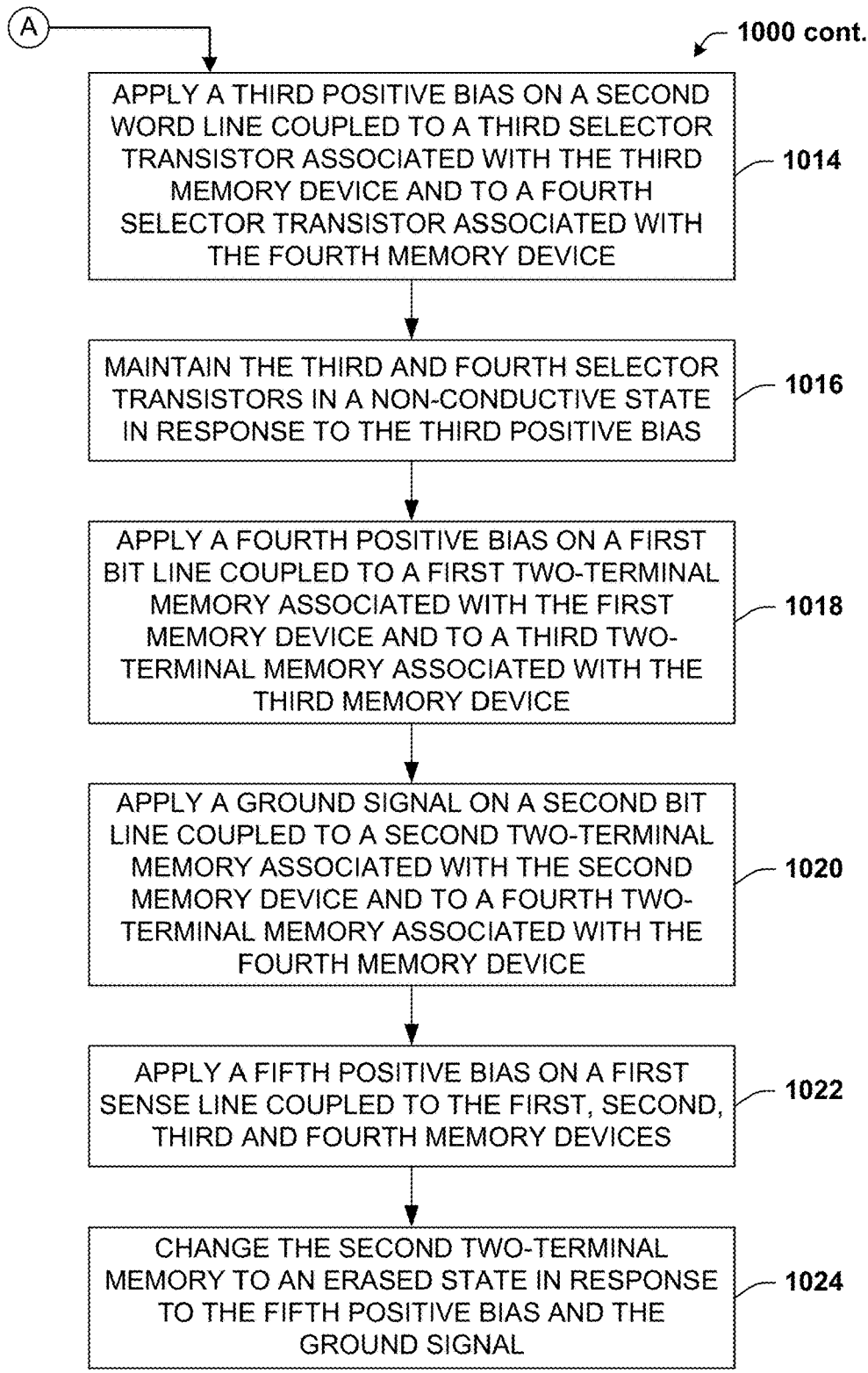

Referring now to FIG. 11, at 1014 method 1000 can comprise applying a third positive bias on a second word line coupled to a third selector transistor associated with the third memory device and to a fourth selector transistor associated with the fourth memory device. At 1016, method 1000 can comprise maintaining the third and fourth selector transistors in a non-conductive state in response to the third positive bias.

At 1018, method 1000 can comprise applying a fourth positive bias on a first bit line coupled to a first two-terminal memory associated with the first memory device and to a third two-terminal memory associated with the third memory device. At 1020, method 1000 can comprise applying a ground signal on a second bit line coupled to a second two-terminal memory associated with the second memory device and to a fourth two-terminal memory associated with the fourth memory device.

At 1022, method 1000 can comprise applying a fifth positive bias on a first source line coupled to the first, second, third and fourth memory devices. At 1024, method 1000 can comprise changing the second two-terminal memory to an erased state in response to the fifth positive bias and the ground signal.

In some embodiments, the fifth positive bias signal comprises an erase bias signal. In such embodiment, the method can further comprise erasing the second two-terminal memory in response to the erase bias signal. In other embodiments, a leakage current of the fourth select transistor is reduced in response to applying the third positive bias signal on the second word line. In one or more additional embodiments, a maximum voltage of the first positive bias signal can be within a range of about 2 to about 2.5 volts, a maximum voltage of the second positive bias signal can be within a range of about 2 to about 2.5 volts, and a maximum voltage of the third positive bias signal can be within a range of about 1 to about 1.2 volts. In another embodiment(s), a maximum voltage of the fourth positive bias signal can be within a range of about 1.7 to about 1.9 volts, and a maximum voltage of the fifth positive bias signal can be within a range of about 1.9 to about 2 volts. In alternative or additional embodiments, the first positive bias signal, the second positive bias signal, the third positive bias signal, the fourth positive bias signal or the fifth positive bias signal can be selected from a group consisting of: a voltage pulse, a ramp voltage, a series of voltage pulses and a suitable combination of the foregoing.

Example Operating Environments

Figure 12:
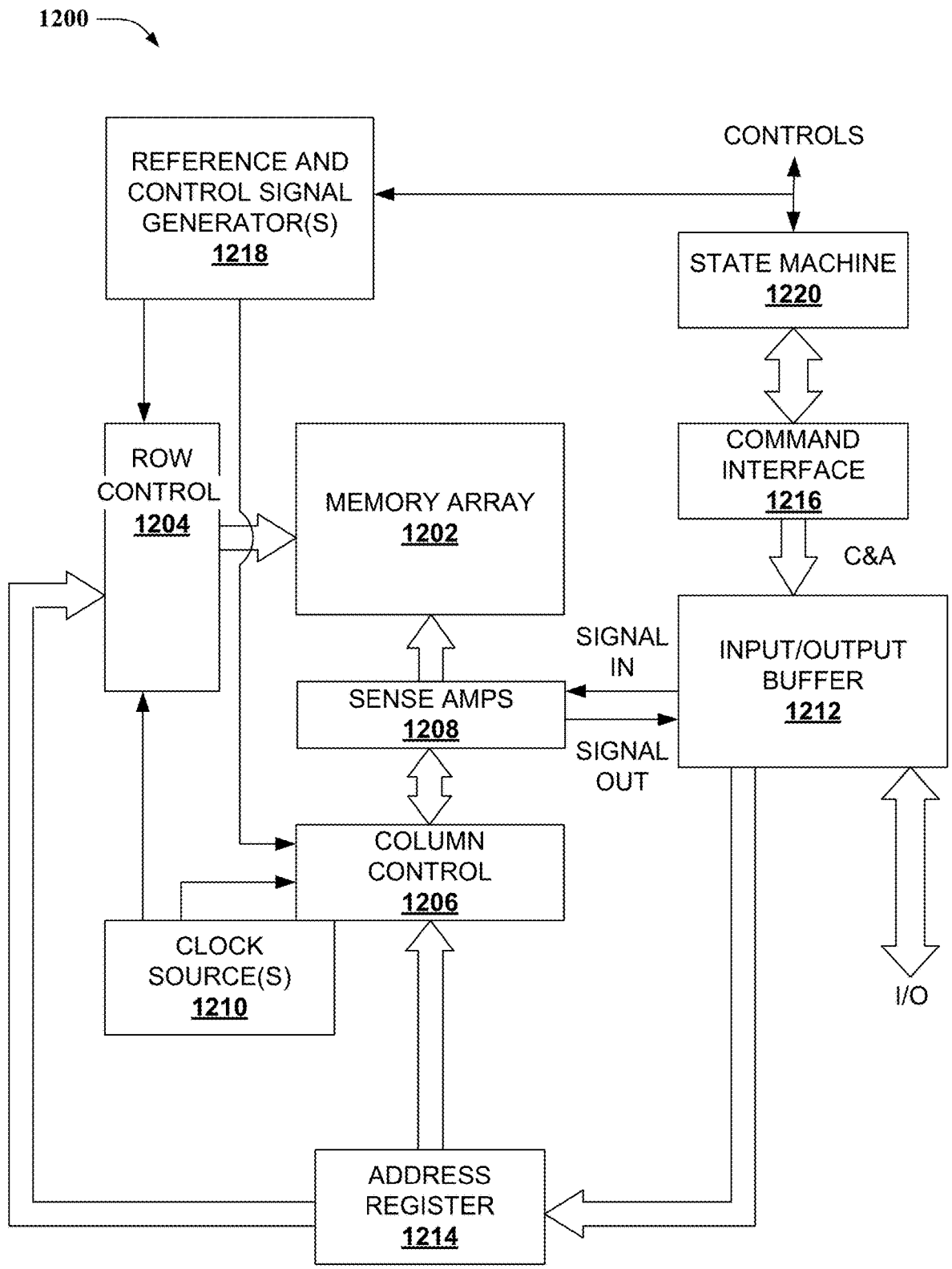
FIG. 12 illustrates a block diagram of an example electronic operating environment in accordance with certain embodiments presented herein.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of semiconductor architectures and process methodologies for operating arrays of two-terminal memory devices, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects can also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 12 illustrates a block diagram of an example operating and control environment 1200 for a memory array 1202 of a multi-block memory cell array according to aspects of the subject disclosure. In at least one aspect of the subject disclosure, memory array 1202 can comprise memory selected from a variety of memory cell technologies. In at least one embodiment, memory array 1202 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 1202 can be configured to operate according to bulk program or erase operations as provided herein.

A column controller 1206 and sense amps 1208 can be formed adjacent to memory array 1202. Moreover, column controller 1206 can be configured to activate (or identify for activation) a subset of bitlines of memory array 1202. Column controller 1206 can utilize a control signal provided by a reference and control signal generator(s) 1218 to activate, as well as operate upon, respective ones of the subset of bitlines, applying suitable program, erase or read voltages to those bitlines. Non-activated bitlines can be kept at an inhibit voltage (also applied by reference and control signal generator(s) 1218), to mitigate or avoid bit-disturb effects on these non-activated bitlines.

In addition, operating and control environment 1200 can comprise a row controller 1204. Row controller 1204 can be formed adjacent to and electrically connected with word lines (and source lines, in some embodiments) of memory array 1202. Further, utilizing control signals of reference and control signal generator(s) 1218, row controller 1204 can select particular rows of memory cells with a suitable selection voltage. Moreover, row controller 1204 can facilitate program, erase or read operations by applying suitable voltages at selected word lines (and source lines). Similar to column controller 1206, row controller 1204 can apply an inhibit voltage to non-activated wordlines (source lines) to mitigate or avoid bit-disturb effects on the non-activated wordlines (source lines).

Sense amps 1208 can read data from, or write data to the activated memory cells of memory array 1202, which are selected by column control 1206 and row control 1204. Data read out from memory array 1202 can be provided to an input and input/output buffer 1212. Likewise, data to be written to memory array 1202 can be received from the input and input/output buffer 1212 and written to the activated memory cells of memory array 1202.

A clock source(s) 1210 can provide respective clock pulses to facilitate timing for read, write, and program operations of row controller 1204 and column controller 1206. Clock source(s) 1210 can further facilitate selection of wordlines or bitlines in response to external or internal commands received by operating and control environment 1200. Input and input/output buffer 1212 can comprise a command and address input, as well as a bidirectional data input and output. Instructions are provided over the command and address input, and the data to be written to memory array 1202 as well as data read from memory array 1202 is conveyed on the bidirectional data input and output, facilitating connection to an external host apparatus, such as a computer or other processing device (not depicted, but see e.g., computer 1302 of FIG. 13, infra).

Input and input/output buffer 1212 can be configured to receive write data, receive an erase instruction, receive a status or maintenance instruction, output readout data, output status information, and receive address data and command data, as well as address data for respective instructions. Address data can be transferred to row controller 1204 and column controller 1206 by an address register 1214. In addition, input data is transmitted to memory array 1202 via signal input lines between sense amps 1208 and input and input/output buffer 1212, and output data is received from memory array 1202 via signal output lines from sense amps 1208 to input and input/output buffer 1212. Input data can be received from the host apparatus, and output data can be delivered to the host apparatus via the I/O bus.

Commands received from the host apparatus can be provided to a command interface 1216. Command interface 1216 can be configured to receive external control signals from the host apparatus, and determine whether data input to the input and input/output buffer 1212 is write data, a command, or an address. Input commands can be transferred to a state machine 1220.

State machine 1220 can be configured to manage programming and reprogramming of memory array 1202 (as well as other memory banks of the multi-bank memory array). Instructions provided to state machine 1220 are implemented according to control logic configurations, enabling state machine 1220 to manage read, write, erase, data input, data output, and other functionality associated with memory array 1202. In some aspects, state machine 1220 can send and receive acknowledgments and negative acknowledgments regarding successful receipt or execution of various commands. In further embodiments, state machine 1220 can decode and implement status-related commands, decode and implement configuration commands, and so on.

To implement read, write, erase, input, output, etc., functionality, state machine 1220 can control clock source(s) 1210 or reference and control signal generator(s) 1218. Control of clock source(s) 1210 can cause output pulses configured to facilitate row controller 1204 and column controller 1206 implementing the particular functionality. Output pulses can be transferred to selected bitlines by column controller 1206, for instance, or wordlines by row controller 1204, for instance.

Figure 13:
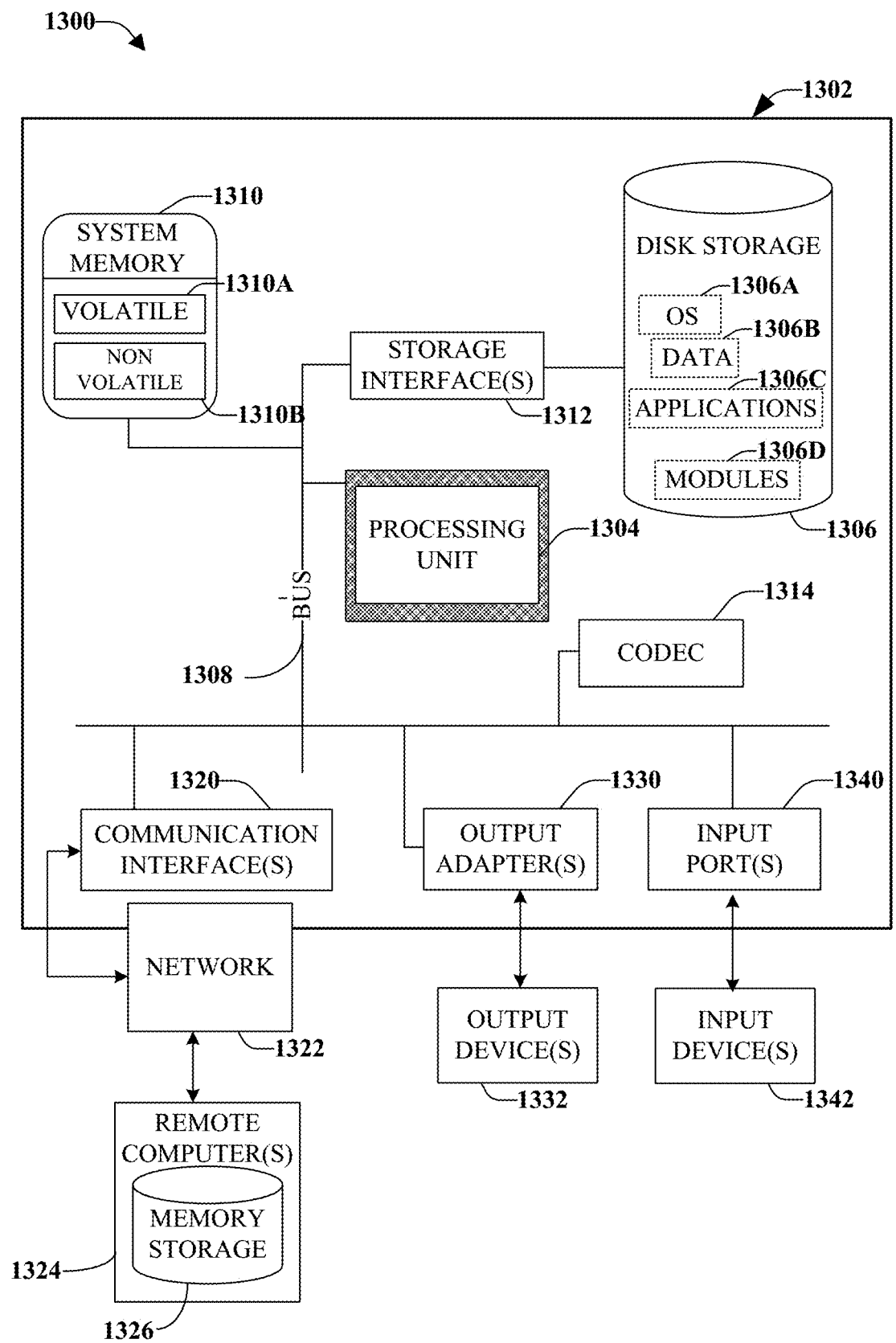
FIG. 13 depicts a block diagram of a sample computing environment for implementing one or more disclosed embodiments of the present disclosure.

With reference to FIG. 13, a suitable environment 1300 for implementing various aspects of the claimed subject matter includes a computer 1302. The computer 1302 includes a processing unit 1304, a system memory 1310, a codec 1314, and a system bus 1308. The system bus 1308 couples system components including, but not limited to, the system memory 1310 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1310 includes volatile memory 1310A and non-volatile memory 1310B. The basic input/output system (BIOS), containing the basic routines to transfer information between elements within the computer 1302, such as during start-up, is stored in non-volatile memory 1310B. In addition, according to present innovations, codec 1314 may include at least one of an encoder or decoder, wherein the at least one of an encoder or decoder may consist of hardware, software, or a combination of hardware and software. Although, codec 1314 is depicted as a separate component, codec 1314 may be contained within non-volatile memory 1310B. By way of illustration, and not limitation, non-volatile memory 1310B can include read only memory (ROM), programmable ROM (PROM), electrically programmable ROM (EPROM), electrically erasable programmable ROM (EEPROM), or flash memory, two-terminal memory, and so on. Volatile memory 1310A includes random access memory (RAM), which acts as external cache memory. According to present aspects, the volatile memory may store the write operation retry logic (not shown in FIG. 13) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1302 may also include removable/non-removable, volatile/non-volatile computer storage medium. FIG. 13 illustrates, for example, disk storage 1306. Disk storage 1306 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1306 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1306 to the system bus 1308, a removable or non-removable interface is typically used, such as storage interface 1312. It is appreciated that storage devices 1306 can store information related to a user. Such information might be stored at or provided to a server or to an application running on a user device. In one embodiment, the user can be notified (e.g., by way of output device(s) 1332) of the types of information that are stored to disk storage 1306 or transmitted to the server or application. The user can be provided the opportunity to opt-in or opt-out of having such information collected and/or shared with the server or application (e.g., by way of input from input device(s) 1342).

It is to be appreciated that FIG. 13 describes software that acts as an intermediary between users and the basic computer resources described in the suitable operating environment 1300. Such software includes an operating system 1306A. Operating system 1306A, which can be stored on disk storage 1306, acts to control and allocate resources of the computer system 1302. Applications 1306C take advantage of the management of resources by operating system 1306A through program modules 1306D, and program data 1306D, such as the boot/shutdown transaction table and the like, stored either in system memory 1310 or on disk storage 1306. It is to be appreciated that the claimed subject matter can be implemented with various operating systems or combinations of operating systems.

A user enters commands or information into the computer 1302 through input device(s) 1342. Input devices 1342 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via input port(s) 1340. Input port(s) 1340 include, for example, a serial port, a parallel port, a game port, and a universal serial bus (USB). Output device(s) 1332 use some of the same type of ports as input device(s) 1342. Thus, for example, a USB port may be used to provide input to computer 1302 and to output information from computer 1302 to an output device 1332. Output adapter 1330 is provided to illustrate that there are some output devices 1332 like monitors, speakers, and printers, among other output devices 1332, which require special adapters. The output adapters 1330 include, by way of illustration and not limitation, video and sound cards that provide a means of connection between the output device 1332 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1324. The remote computer(s) 1324 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1326 is illustrated with remote computer(s) 1324. Remote computer(s) 1324 is logically connected to computer 1302 through a network 1322 and then connected via communication interface(s) 1320. Network 1322 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1320 refers to the hardware/software employed to connect the network 1322 to the bus 1308. While communication interface(s) 1320 is shown for illustrative clarity inside computer 1302, it can also be external to computer 1302. The hardware/software necessary for connection to the network 1322 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising".

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g. 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device comprising:
a semiconductor substrate;
a plurality of memory devices disposed upon the semiconductor substrate, wherein each memory device of the plurality of memory devices comprises a selector transistor, a control transistor, and a two-terminal memory cell, wherein the selector transistor is connected to the control transistor, wherein the control transistor is connected to a first terminal of the two-terminal memory cell, wherein the plurality of memory devices includes a first memory device and a second memory device;
a plurality control lines disposed upon the semiconductor substrate and connected to the plurality of memory devices, wherein the plurality of control lines extend in a first direction, wherein the plurality of control lines comprises a first control line, and wherein the first control line is connected to a control transistor of the first memory device and to a control transistor of the second memory device;
a plurality of word lines disposed upon the semiconductor substrate and connected to the plurality of memory devices, wherein the plurality of word lines extend in the first direction, wherein the plurality of word lines comprises a first word line, and wherein the first word line is connected to a selector transistor of the first memory device and to a selector transistor of the second memory device;
a plurality of bitlines disposed upon the semiconductor substrate and connected to the plurality of memory devices, wherein the plurality of bitlines extend in a second direction, wherein the first direction is different from the second direction, wherein the plurality of bitlines comprises a first bitline and a second bitline, wherein the first bitline is connected to a second terminal of a two-terminal memory cell in the first memory device, and wherein the second bitline is connected to a second terminal of a two-terminal memory cell in the second memory device; and
a plurality of source lines disposed upon the semiconductor substrate and connected to the plurality of memory devices, wherein the plurality of source lines extend in the second direction, wherein the plurality of source lines comprises a first source line, and wherein the first source line is connected to the selector transistor of the first memory device and to the selector transistor of the second memory device.

2. The semiconductor device of claim 1
wherein the plurality of memory devices includes a third memory device and a fourth memory device;
wherein the plurality of control lines comprises a second control line, and wherein the second control line is connected to a control transistor of the third memory device and to a control transistor of the fourth memory device;
wherein the plurality of word lines comprises a second word line, and wherein the second word line is connected to a selector transistor of the third memory device and to a selector transistor of the fourth memory device;
wherein the first bitline is connected to a second terminal of a two-terminal memory cell in the third memory device, and wherein the second bitline is connected to a second terminal of a two-terminal memory cell in the fourth memory device; and
wherein the first source line is connected to the selector transistor of the third memory device and to the selector transistor of the fourth memory device.

3. The semiconductor device of claim 1
wherein the selector transistor comprises a source, a drain, and a gate;
wherein the control transistor comprises a source, a drain, and a gate;

wherein the gate of the control transistor of the first memory device is connected to the first control line;
wherein the source of the control transistor of the first memory device is connected to a first terminal of the first two-terminal memory cell of the first memory device;
wherein the drain of the control transistor of the first memory device is connected to the source of the selector transistor of the first memory device;
wherein the gate of the selector transistor of the first memory device is connected to the first word line; and
wherein the drain of the selector transistor of the first memory device is connected to the first source line.

4. The semiconductor device of claim 3
wherein the second two-terminal memory cell is characterized by a top electrode and a bottom electrode; and
wherein the second bitline is connected to the top electrode of the two-terminal memory cell in the second memory device.

5. The semiconductor device of claim 3
wherein the second two-terminal memory cell is characterized by a top electrode and a bottom electrode; and
wherein the second bitline is connected to the bottom electrode of the two-terminal memory cell in the second memory device.

6. The semiconductor device of claim 1 wherein the two-terminal memory cell is selected from a group consisting of: conductive filamentary memory, phase-change memory, metal oxide memory, silicon oxide memory, chalcogenide memory, magnetic memory, carbon nanotube memory.

7. The semiconductor device of claim 1 wherein the first two-terminal memory cell comprises a resistive random access memory cell comprising:
an active material layer comprising a plurality of metal particles configured to become a plurality of active metal particles in response to a bias applied across the resistive random access memory cell; and
a resistive switching material layer disposed in contact with the active material layer, wherein the resistive switching material layer comprises a plurality of defect regions;
wherein active metal particles from the plurality of active metal particles are configured to be disposed and trapped within the plurality of defect regions in response to the bias applied across the resistive random access memory cell.

8. The semiconductor device of claim 1 further comprising: a plurality of sense amplifiers connected to the plurality of bit lines, wherein a sense amplifier from the plurality of sense amplifiers is configured to be responsive to an amount of current flowing on a bit line from the plurality of bit lines.

9. A method for operating a semiconductor device having a plurality of memory devices including a first memory device, a second memory device, a third memory device, and a fourth memory device comprises concurrently:
applying a first positive bias on a first control line from a plurality of control lines, wherein the first control line is connected to a first control transistor associated with the first memory device and to a second control transistor associated with the second memory device, wherein the first control transistor enters a conductive state in response to the first positive bias, wherein the second control transistor enters a conductive state in response to the first positive bias;
applying a second positive bias signal on a second control line from the plurality of control lines, wherein the second control line is connected to a third control transistor associated with the third memory device and to a fourth control transistor associated with the fourth memory device, wherein the second positive bias signal is less than the first positive bias signal, wherein the third control transistor remains in a non-conductive state in response to the second positive bias signal, wherein the fourth control transistor remains in a non-conductive state in response to the second positive bias signal;
applying a third positive bias signal on a first word line from a plurality of word lines, wherein the first word line is connected to a first select transistor associated with the first memory device and to a second select transistor associated with the second memory device, wherein the first select transistor enters a conductive state in response to the third positive bias signal, wherein the second select transistor enters a conductive state in response to the third positive bias signal;
applying a ground signal on a second word line from the plurality of word lines, wherein the second word line is connected to a third select transistor associated with the third memory device and to a fourth select transistor associated with the fourth memory device, wherein the third select transistor remains in a non-conductive state in response to the ground signal, wherein the fourth select transistor remains in a non-conductive state in response to the ground signal;
applying the ground signal on a first bit line from a plurality of bit lines, wherein the first bit line is connected to a first two-terminal memory associated with the first memory device and to a third two-terminal memory associated with the third memory device; and
applying a fourth positive bias signal on a second bit line from the plurality of bit lines, wherein the second bit line is connected to a second two-terminal memory associated with the second memory device and to a fourth two-terminal memory associated with the fourth memory device.

10. The method of claim 9
wherein the fourth positive bias signal comprises a program bias signal; and
wherein the method further comprises programming the second two-terminal memory in response to the program bias signal.

11. The method of claim 9
wherein the fourth positive bias signal comprises a read bias signal; and
wherein the method further comprises sensing a current on a first source line from a plurality of source lines, wherein the first source line is connected to the first memory device, the second memory device, the third memory device and the fourth memory device, and wherein the current is associated with a state of the second two-terminal memory.

12. The method of claim 9 wherein a leakage current of the fourth select transistor is reduced in response to applying the second positive bias signal to the second control line.

13. The method of claim 9
wherein a maximum voltage of the first positive bias is within a range of 1-1.2 volts;
wherein a maximum voltage of the second positive bias is within a range of 0.9-1.1 volts.

14. The method of claim 13 wherein the fourth positive bias is within a range of 2-2.3 volts.

15. A method for operating a memory array having a plurality of memory devices including a first memory device, a second memory device, a third memory device, and a fourth memory device comprises concurrently: applying a first positive bias on a first control line from a plurality of control lines, wherein the first control line is connected to a first control transistor associated with the first memory device and to a second control transistor associated with the second memory device, wherein the first control transistor enters a conductive state in response to the first positive bias, wherein the second control transistor enters a conductive state in response to the first positive bias; applying a ground signal on a second control line from the plurality of control lines, wherein the second control line is connected to a third control transistor associated with the third memory device and to a fourth control transistor associated with the fourth memory device, wherein the third control transistor remains in a non-conductive state in response to the ground signal, wherein the fourth control transistor remains in a non-conductive state in response to the ground signal; applying a second positive bias signal on a first word line from a plurality of word lines, wherein the first word line is connected to a first select transistor associated with the first memory device and to a second select transistor associated with the second memory device, wherein the first select transistor enters a conductive state in response to the second positive bias signal, wherein the second select transistor enters a conductive state in response to the second positive bias signal; applying a third positive bias signal on a second word line from the plurality of word lines, wherein the second word line is connected to a third select transistor associated with the third memory device and to a fourth select transistor associated with the fourth memory device, wherein the third select transistor remains in a non-conductive state in response to the third positive bias signal, wherein the fourth select transistor remains in a non-conductive state in response to the third positive bias signal; applying a fourth positive bias signal on a first bit line from a plurality of bit lines, wherein the first bit line is connected to a first two-terminal memory associated with the first memory device and to a third two-terminal memory associated with the third memory device; applying a ground signal on a second bit line from the plurality of bit lines, wherein the second bit line is connected to a second two-terminal memory associated with the second memory device and to a fourth two-terminal memory associated with the fourth memory device; and applying a fifth positive bias on a first source line from a plurality of source lines, wherein the first source line is connected to the first memory device, the second memory device, the third memory device and the fourth memory device.

16. The method of claim 15
wherein the fifth positive bias signal comprises an erase bias signal; and
wherein the method further comprises erasing the second two-terminal memory in response to the erase bias signal.

17. The method of claim 15 wherein a leakage current of the fourth select transistor is reduced in response to applying the third positive bias signal on the second word line.

18. The method of claim 15
wherein a maximum voltage of the first positive bias signal is within a range of 2-2.5 volts;
wherein a maximum voltage of the second positive bias signal is within a range of 2-2.5 volts; and
wherein a maximum voltage of the third positive bias signal is within a range of 1-1.2 volts.

19. The method of claim 18
wherein a maximum voltage of the fourth positive bias signal is within a range of 1.9-2.1 volts; and
wherein a maximum voltage of the fifth positive bias signal is within a range of 1.9-2 volts.

20. The method of claim 15 wherein the first positive bias signal is selected from a group consisting of: a series of voltage pulses, a ramp voltage, a voltage pulse.

* * * * *